(12) United States Patent
Thieme et al.

(10) Patent No.: US 7,816,303 B2
(45) Date of Patent: Oct. 19, 2010

(54) ARCHITECTURE FOR HIGH TEMPERATURE SUPERCONDUCTOR WIRE

(75) Inventors: Cornelis Leo Hans Thieme, Westborough, MA (US); Alexis P. Malozemoff, Lexington, MA (US); Martin W. Rupich, Framingham, MA (US); Urs-Detlev Schoop, Westborough, MA (US); Elliott D. Thompson, Coventry, RI (US); Darren Verebelyi, Oxford, MA (US)

(73) Assignee: American Superconductor Corporation, Devens, MA (US)

( * ) Notice: Subject to any disclaimer, the term of this patent is extended or adjusted under 35 U.S.C. 154(b) by 1461 days.

(21) Appl. No.: 11/193,262

(22) Filed: Jul. 29, 2005

(65) Prior Publication Data
US 2006/0073979 A1     Apr. 6, 2006

Related U.S. Application Data

(60) Provisional application No. 60/615,289, filed on Oct. 1, 2004.

(51) Int. Cl.
*H01L 39/24*     (2006.01)

(52) U.S. Cl. .................. 505/237; 505/329; 505/330; 505/701; 505/702; 428/930

(58) Field of Classification Search .................. 505/237, 505/329, 330, 701, 702; 428/930
See application file for complete search history.

(56) References Cited

U.S. PATENT DOCUMENTS

| | | | | |
|---|---|---|---|---|
| 3,983,521 A | * | 9/1976 | Furuto et al. ............... 335/216 |
| 4,409,425 A | * | 10/1983 | Ries ........................... 174/15.5 |
| 5,047,389 A |   | 9/1991 | Woolf et al. |
| 5,057,489 A | * | 10/1991 | Ohkawa et al. .............. 505/231 |
| 5,318,952 A | * | 6/1994 | Hato ........................... 505/193 |
| 5,379,020 A | * | 1/1995 | Meier et al. .................. 505/211 |
| 5,987,342 A |   | 11/1999 | Scudiere et al. |
| 6,096,565 A |   | 8/2000 | Goland et al. |
| 6,436,317 B1 |   | 8/2002 | Malozemoff et al. |
| 6,444,917 B1 | * | 9/2002 | Scudiere et al. ........... 174/125.1 |
| 6,483,685 B1 | * | 11/2002 | Ramarge et al. ............. 361/118 |
| 6,522,236 B1 |   | 2/2003 | Ries et al. |

(Continued)

FOREIGN PATENT DOCUMENTS

JP     2003-206134     7/2003

(Continued)

OTHER PUBLICATIONS

U.S. Appl. No. 09/615,999.

(Continued)

*Primary Examiner*—Steven Bos
*Assistant Examiner*—Paul A Wartalowicz
(74) *Attorney, Agent, or Firm*—Occhiuti Rohlicek & Tsao LLP

(57) ABSTRACT

A laminated superconductor wire includes a superconductor wire assembly, which includes a first superconductor insert comprising a first high temperature superconductor layer overlaying a first substrate and a second superconductor insert comprising a second high temperature superconductor layer overlaying a second substrate. The first and second superconductor inserts are joined together at their respective substrates. An electrically conductive structure substantially surrounds the superconductor wire assembly.

37 Claims, 13 Drawing Sheets

U.S. PATENT DOCUMENTS

| | | | |
|---|---|---|---|
| 6,624,122 | B1 | 9/2003 | Holesinger et al. |
| 6,657,533 | B2 | 12/2003 | Snitchler et al. |
| 6,690,957 | B2 | 2/2004 | Akasegawa et al. |
| 6,716,545 | B1 | 4/2004 | Holesinger et al. |
| 6,730,410 | B1 | 5/2004 | Fritzemeier et al. |
| 6,745,059 | B2 | 6/2004 | Buczek et al. |
| 6,784,362 | B1 | 8/2004 | Buczek et al. |
| 6,797,313 | B2 | 9/2004 | Fritzemeier et al. |
| 6,828,507 | B1 * | 12/2004 | Fritzemeier et al. ...... 174/125.1 |
| 6,974,501 | B1 | 12/2005 | Zhang et al. |
| 7,071,148 | B1 * | 7/2006 | Selvamanickam et al. ... 505/234 |
| 2003/0164749 | A1 * | 9/2003 | Snitchler et al. ........... 338/32 S |
| 2004/0192559 | A1 | 9/2004 | Araki et al. |
| 2004/0266628 | A1 * | 12/2004 | Lee et al. .................... 505/238 |
| 2005/0065035 | A1 | 3/2005 | Rupich et al. |
| 2006/0040830 | A1 | 2/2006 | Thieme et al. |
| 2006/0073975 | A1 | 4/2006 | Thieme et al. |
| 2006/0094603 | A1 | 5/2006 | Li et al. |

FOREIGN PATENT DOCUMENTS

| | | |
|---|---|---|
| SU | 1831470 | 7/1993 |

OTHER PUBLICATIONS

U.S. Appl. No. 10/758,710.
U.S. Appl. No. 10/858,309.
U.S. Appl. No. 10/955,875, Thieme et al.
U.S. Appl. No. 11/193,262.
U.S. Appl. No. 11/494,993, filed Jul. 28, 2006, Kodenkandath et al.
U.S. Appl. No. 60/615,289, filed Oct. 1, 2004, Li et al.
U.S. Appl. No. 60/677,001, filed Mar. 31, 2005, Thieme.
Liu et al. Wetting Reaction of Sn-Ag Based Solder Systems on Cu Substrates Plated with Au and/or Pd layer. Journal of Electronic Materials. vol. 30 No. 5 2001 abstract.
PCT, International Search Report Oct. 17, 2007.
Alexis P. Malozemoff, "Second Generation HTS Wire: An Assessment," American Superconductor Corporation White Paper, Dec. 2004, 15 pages.

* cited by examiner

ARCHITECTURE FOR HIGH TEMPERATURE SUPERCONDUCTOR WIRE

RELATED APPLICATIONS

This application is related to the following applications, the entire contents of which are incorporated herein by reference:

U.S. patent application Ser. No. 60/703,815, filed on an even date herewith and entitled "High Temperature Superconductive Wires and Coils;"

U.S. Provisional Application Ser. No. 60/703,836, filed on an even date herewith and entitled "Thick Superconductor Films With Improved Performance;" and U.S. Provisional Application Ser. No. 60/615,289, filed on Oct. 1, 2004 and entitled "Thick Superconductor Films With Improved Performance."

TECHNICAL FIELD

This invention relates to the field of high temperature superconductors. In particular, the invention relates to coated conductor, also called second generation, high temperature superconductor wires and tapes.

BACKGROUND

High temperature superconductor (HTS) materials provide a means for carrying extremely large amounts of current with extremely low loss. HTS materials lose all resistance to the flow of direct electrical current and nearly all resistance to the flow of alternating current when cooled below a critical temperature. The development of HTS wires (the expression "wires" is used here for a variety of conductors, including tape-like conductors) using these materials promises a new generation of high efficiency, compact, and environmentally friendly electrical equipment, which has the potential to revolutionize electric power grids, transportation, materials processing, and other industries. However a commercially viable product has stringent engineering requirements, which has complicated the implementation of the technology in commercial applications.

In the second generation HTS wire technology, currently under development, the HTS material is generally a polycrystalline rare-earth/alkaline-earth/copper oxide, e.g. yttrium-barium-copper oxide (YBCO). The current carrying capability of the HTS material is strongly related to its crystalline alignment or texture. Grain boundaries formed by the misalignment of neighboring crystalline HTS grains are known to form an obstacle to superconducting current flow, but this obstacle decreases with the increasing degree of alignment or texture. Therefore to make the material into a commercially viable product, e.g. an HTS wire, the HTS material must maintain a high degree of crystalline alignment or texture over relatively long distances. Otherwise, the superconducting current carrying capacity (critical current density) will be limited.

HTS materials can be fabricated with a high degree of crystallographic alignment or texture over large areas by growing a thin layer of the material epitaxially on top of a flexible tape-shaped substrate, fabricated so that it has a high degree of crystallographic texture at its surface. When the crystalline HTS material is grown epitaxially on this surface, the crystal alignment of the HTS material grows to match the texture of the substrate. In other words, the substrate texture provides a template for the epitaxial growth of the crystalline HTS material. Further, the substrate provides structural integrity to the HTS layer.

A substrate can be textured to provide a template that yields an epitaxial HTS layer with excellent superconducting properties such as high critical current density. Materials such as nickel, copper, silver, iron, silver alloys, nickel alloys, iron alloys, stainless steel alloys, and copper alloys can be used, among others. The substrate can be textured using a deformation process, such as one involving rolling and recrystallization annealing the substrate. An example of such a process is the rolling-assisted biaxially textured substrate (RABiTS) process. In this case large quantities of metal can be processed economically by deformation processing and annealing and can achieve a high degree of texture. Strips of metal as wide as, e.g., 4 cm have thus far been produced by this method, which can each then be slit into numerous smaller wires (e.g. 10 strips of 0.4 cm wires).

One or more buffer layers can be deposited or grown on the substrate surface with suitable crystallographic template on which to grow the HTS material. Buffer layers also can provide the additional benefit of preventing diffusion over time of atoms from the substrate material into the crystalline lattice of the HTS material or of oxygen into the substrate material. This diffusion, or "poisoning," can disrupt the crystalline alignment and thereby degrade the electrical properties of the HTS material. Buffer layers also can provide enhanced adhesion between the substrate and the HTS layer. Moreover, the buffer layer(s) can have a coefficient of thermal expansion that is well matched to that of the superconductor material. For implementation of the technology in commercial applications, where the wire may be subjected to stress, this feature is desirable because it can help prevent delamination of the HTS layer from the substrate.

Alternatively, a non-textured substrate such as Hastelloy can be used, and textured buffer layers deposited by means such as the ion-beam-assisted deposition (IBAD) or inclined substrate deposition (ISD). Additional buffer layers may be optionally deposited epitaxially on the IBAD or ISD layer to provide the final template for epitaxial deposition of an HTS layer.

By using a suitable combination of a substrate and one or more buffer layers as a template, an HTS layer can be grown epitaxially with excellent crystal alignment or texture, also having good adhesion to the template surface, and with a sufficient barrier to poisoning by atoms from the substrate. The HTS layer can be deposited by any of a variety of methods, including the metal-organic deposition (MOD) process, metal-organic chemical vapor deposition (MOCVD), pulsed laser deposition (PLD), thermal or e-beam evaporation, or other appropriate methods. Lastly, a cap layer can be added to the multilayer assembly, which helps prevent contamination of the HTS layer from above. The cap layer can be, e.g., silver, and can be, e.g., sputtered onto the HTS layer. An exemplary multilayer HTS assembly includes a biaxially textured substrate of nickel with 5% tungsten alloy; sequentially deposited epitaxial layers of $Y_2O_3$, YSZ, and $CeO_2$; epitaxial layer of YBCO; and a cap layer of Ag. Exemplary thicknesses of these layers are: a substrate of about 25-75 microns, buffer layers of about 75 nm each, a YBCO layer of about 1 micron, and a cap layer of about 1-3 microns. HTS wires as long as 100 m have been manufactured thus far using techniques such as those described above. In this assembly the bottom of the substrate can be considered the "back" of the assembly, and the top of the cap layer can be considered the "front."

During use, it is desirable that the HTS wire is able to tolerate bend strains. A bend induces tensile strain on the convex outer surface of the bend, and compressive strain on the concave inner surface of the bend, thereby subjecting the HTS layer to tensile or compressive strains depending on the direction in which the wire is bent. While a modest amount of compressive stress can actually enhance the current carrying capacity of an HTS layer, in general subjecting the whole assembly to stress (especially repeated stress) places the wire at risk of mechanical damage. For example, cracks could be formed and propagate in the HTS layer, degrading its mechanical and electrical properties, or the different layers could delaminate from each other or from the substrate.

Methods for reducing stress in the HTS layer are described, e.g., in U.S. Pat. No. 6,745,059 and U.S. Pat. No. 6,828,507. For example, a copper strip, chosen to have similar thickness and mechanical features to the substrate, can be bonded onto the upper surface of the insert. This sandwiches the HTS layer roughly in the middle of the overall structure, so if the assembly is bent, the HTS layer is neither at the outer nor inner surface of the bend. Two of these assemblies can also be bonded together at their respective copper strips to form a single HTS wire assembly. In this case, the two substrates face outward, and the copper tapes are in the middle of the assembly. In this case the inclusion of a second assembly provides additional current carrying capacity; however, electrical contact to the HTS layers requires splicing the wire open, or partially removing one of the inserts in the contact section.

A further issue for coated conductor HTS wires is that of environmental contamination when the wire is in use. Environmental exposure can slowly degrade the electrical performance of HTS layers. Also, in the presence of cryogenic liquids such as liquid nitrogen in contact with the wire, the liquid can diffuse into pores within the wire, and on warming can form "balloons" that can damage the wire. Sealing the wire is desirable to prevent either environmental exposure of the HTS layers or penetration of the liquid cryogen into the wire. Seals for HTS assemblies are described in, e.g. U.S. Pat. No. 6,444,917.

SUMMARY

Multilayer high temperature superconductor (HTS) wires are described having improved current sharing, good mechanical properties, superior isolation of the HTS assembly from the environment, more efficient electrical contact with external electrical connections or joints, and/or enhanced electrical stabilization. HTS wires having electrical stabilization that protects the HTS layers in the case of an overcurrent, i.e. a current that exceeds the critical current of the HTS layers, also are described. An overcurrent can cause the HTS layers to become resistive, and to generate heat. Electrical stabilization provides an alternate current path if current flow in a local region of an HTS layer is blocked by a crack or other defect.

A laminated superconductor wire, according to one aspect of the invention, includes a superconductor wire assembly having a length and a width. The assembly includes a first superconductor insert having a first high temperature superconductor layer overlaying a first substrate, and a second superconductor insert having a second high temperature superconductor layer overlaying a second substrate. The first and second superconductor inserts are joined together at their respective substrates. An electrically conductive structure substantially surrounding the superconductor wire assembly is also included.

In one aspect of the invention, the electrically conductive structure includes a first conductive strip and a second conductive strip, and the superconductor wire assembly is interposed between and is in electrical contact with the first and second conductive strips. The structure also includes a substantially nonporous electrically conductive filler. The filler extends between the first and second conductive strips along the length of the superconductor wire assembly. In one or more embodiments, the first and second conductive strips have a width that is greater than the width of the superconductor wire assembly.

In another aspect of the invention, the electrically conductive structure includes an electrically conductive layer that partially surrounds and is in electrical contact with the superconductor wire assembly along at least three sides. The structure also includes a substantially nonporous electrically conductive filler, wherein the filler substantially surrounds the superconductor wire assembly and bonds it to the conductive layer. In one or more embodiments, the substantially nonporous electrically conductive filler substantially fills voids in the superconductor wire assembly and between the superconductor wire assembly and the conductive layer.

In another aspect of the invention, the electrically conductive structure includes an electrically conductive material substantially surrounding and in electrical contact with the superconductor wire assembly. In one or more embodiments, the electrically conductive material includes a material selected from the group of electrically conductive polymers, polymers filled with fine metal powder, and conductive glue.

In one or more embodiments, the electrically conductive material includes a conductive foil wrapped around the superconductor wire assembly. In one or more embodiments, at least one layer of a substantially nonporous material substantially surrounds the conductive foil.

In one or more embodiments, a bonding material bonds the first substrate and second substrate together. The bonding material may be a material selected from the group of electrically conductive materials and electrically nonconductive materials. The bonding material may include the same material as the substantially nonporous electrically conductive filler. The bonding material may include at least one layer of a conductive material and at least one layer of a non-conductive material. In one or more embodiments, the first substrate and second substrate have surfaces that are treated to provide electrical contact between the substrates.

In one or more embodiments, the first and second substrates have a corresponding first and second wetting layer deposited on a surface of the substrate that opposes the surface that the HTS layer overlays.

In one or more embodiments, a layer of conductive material substantially surrounds the superconductor wire assembly.

In another aspect of the invention, a laminated superconductor wire includes a superconductor wire insert, having a length and a width. The insert includes a high temperature superconductor layer overlaying a surface of a substrate, and a wetting layer deposited on a surface of the substrate opposing the high temperature superconductor layer. The wire also includes an electrically conductive structure, which substantially surrounds the superconductor wire insert. The electrically conductive structure includes a first conductive strip and a second conductive strip, wherein the superconductor wire insert is interposed between and is in electrical contact with the first and second conductive strips. The electrically conductive structure also includes a substantially nonporous electrically conductive filler, which extends between the first and second conductive strips along the length of the superconductor wire insert.

In one or more embodiments, the first and second conductive strips have a width that is greater than the width of the superconductor wire assembly.

In one or more embodiments, a a layer of conductive material substantially surrounds the superconductor wire insert.

According to one aspect of the invention, a method of making a laminated superconductor wire includes providing a superconductor wire assembly having a length and a width. The assembly includes a first superconductor insert, having a first high temperature superconductor layer overlaying a first substrate, and a second superconductor insert having a second high temperature superconductor layer overlaying a second substrate. The first and second superconductor inserts are joined together at their respective substrates. The method includes laminating the first and second high temperature superconductor layers to corresponding first and second conductive strips with a substantially nonporous electrically conductive filler. The method includes depositing additional filler between the first and second conductive strips along the length of the superconductor wire assembly, such that the first and second conductive strips and the filler together substantially surround the superconductor wire assembly.

In one or more embodiments, the method includes providing a bonding material between the first and second substrate. In one or more embodiments, the method includes providing first and second wetting layers on a surface of the corresponding first and second substrates opposite the high temperature superconductor layer.

In one or more embodiments of the invention, the first and/or second superconductor layers may be made from a rare earth-alkaline earth-copper oxide. Also, a buffer layer may be interposed between the first and/or second superconductor layers and the one or more corresponding substrates. Also, an electrically conductive cap layer may be interposed between, and in electrical contact with, the electrically conductive structure and a corresponding superconductor layer.

In another aspect of the invention, a superconductor wire assembly includes: a first superconductor insert, which includes a first substrate, a first buffer layer overlaying the first substrate, a first high temperature superconductor layer overlaying the first buffer layer, and a cap layer overlaying the first high temperature superconductor layer; and a second superconductor insert, which includes a second substrate, a second buffer layer overlaying the second substrate, a second high temperature superconductor layer overlaying the second buffer layer, and a cap layer overlaying the first high temperature superconductor layer. The first and second superconductor inserts are joined together at their respective substrates.

The laminated superconductor wires, according to one or more embodiments of the invention, have a high current carrying capacity, and at the same time may have improved current sharing, superior isolation of the HTS assembly from the environment, and ease of use over previously known wire architectures.

The expression "HTS insert" is intended to indicate a multilayer structure including a substrate, one or more buffer layers, an HTS layer, and a cap layer. Generally in this HTS insert, the HTS layer is electrically isolated from the metallic substrate by the buffer layer(s). However, if electrically conductive buffer layers are used, the HTS layer can be electrically connected to the metal substrate. Alternatively, an electrically conductive cap layer can be in contact with both the HTS layer and the substrate, and provide electrical contact between the two.

The expression "HTS assembly" is intended to indicate a structure that includes at least one HTS insert, but which may possibly include one or more HTS inserts and/or other added layers. The expression "HTS wire" or "HTS tape" is intended to indicate an HTS insert or assembly that includes an outer structure or coating that generally provides structural, thermal, and/or electrical stabilization to the HTS insert or assembly.

The expression "sealed" is intended to mean substantially surrounded and substantially physically isolated from the environment. The expression "sealed" may include, but is not required to include, substantial impermeability to penetration from gas or liquid under normal circumstances.

BRIEF DESCRIPTION OF THE DRAWINGS

The invention is described with reference to the following figures, which are presented for the purpose of illustration only and which are not intended to be limiting of the invention.

DETAILED DESCRIPTION

High temperature superconducting wires with an electrically conductive outer structure are described. The conductive outer structure has the features, among others, of substantially sealing the wire and of providing electrical contact from the outside of the wire to the HTS insert. The conductive outer structure further may have the feature of providing electrical contact between the two HTS inserts.

Figure 1:
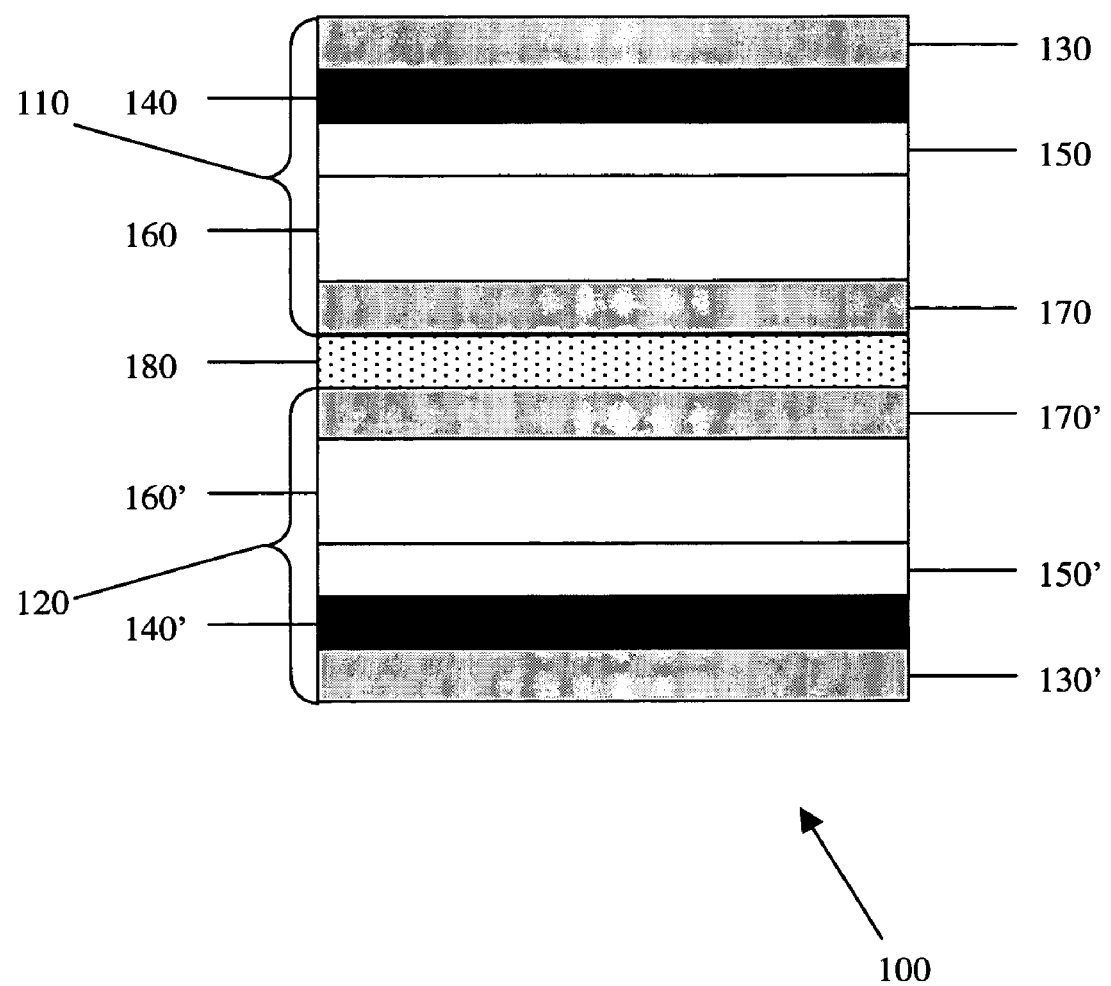
FIG. 1 is a cross-sectional illustration of an assembly having two HTS inserts joined at their substrates.

A multilayer HTS assembly according to one or more embodiments of the invention is shown in cross-section in FIG. 1. It should be noted that in this and all subsequent figures, the dimensions are not to scale. Assembly 100 is made up of two HTS inserts 110 and 120. Each of these inserts is fabricated using techniques known in the art and that are described in greater detail below. Insert 110 includes a metal substrate 160. At least a surface of substrate 160 is biaxially textured to provide a crystal template for buffer layer 150 and HTS layer 140. One or more buffer layer(s) 150 is above substrate 160 and may comprise one or more layers. In one or more embodiments, the buffer layer is made up of an electrically insulating material, though electrically conductive materials can be used. The buffer layer is made up of, e.g., an inert metal, an oxide, zirconate, titanate, niobate, nitride, tantalate, aluminate, cuprate, manganate, or ruthenate of a metal or rare earth element (e.g. $Al_2O_3$, $CeO_2$, $Y_2O_3$, MgO, $Gd_2O_3$, strontium titanate, gadolinium zirconate, yttria-stabilized zirconia, AlN, $Si_3N_4$, $LaMnO_4$, $La_2Zr_2O_7$, or $La_{2-x}Ce_xZr_2O_7$. Any material, or combination of materials, that provides a suitable texture on which to grow an HTS crystal can be used. HTS layer 140 is above buffer layer 150 may be any HTS material. In one or more embodiments, the HTS layer includes a rare earth-alkaline earth-copper oxide, such as YBCO. Cap layer 130 is located above HTS layer 140 and provides protection of the HTS layer from chemical and mechanical degradation. The cap layer may be sputtered Ag or other inert metal. Insert 120 may have the identical or similar structure, including substrate 160', one or more buffer layer(s) 150', HTS layer 140', and cap layer 130'. Further details may be found in commonly-owned U.S. patent application Ser. No. 60/703,815, entitled "High Temperature Superconducting Wires and Coils," filed on an even date herewith, which is hereby incorporated in its entirety by reference.

In order to facilitate bonding between HTS inserts 110 and 120, several different approaches are contemplated. These approaches can be readily implemented in the fabrication of laminated superconductor wires, and may be advantageous in manufacturing long lengths of HTS wire. In one approach, respective wetting layers 170 and 170' can optionally be coated onto respective substrates 160 and 160'. These wetting layers facilitate the bonding of each insert to adhesive layer 180, and therefore facilitate the bonding of each insert to the other. In one or more embodiments, adhesive layer 180 is made of solder. An exemplary solder is Pb—Sn—Ag. During processing, the back surfaces of the metallic substrates (i.e. the surfaces that do not face the buffer layer) may grow a native oxide layer, which is an electrical insulator. This oxide layer typically does not wet solder, i.e. does not bond to solder. It has been surprisingly discovered that the addition of Ag wetting layers 170 and 170' to substrates 160 and 160', respectively, makes the back surface wettable, i.e. bondable, to solder adhesive layer 180. Thus, bonding can be accomplished by soldering wetting layers that are bonded to the native oxide surfaces of the substrates.

Deposition of Ag by DC sputtering is a standard operation. Translating coated conductor tape thought the plasma in a continuous mode without degradation of the superconductor properties requires cooling of the tape as it passes through the plasma. The tape is pulled across a cooling block that is positioned opposite the target to minimize the maximum temperature of the tape during deposition to below ~200 C. Proximity to the target may be required for adhesion of the Ag layer on the oxide surface. Energy imparted from the plasma likely cleans the deposition surface in situ and deposits the Ag ions with enough impact energy to make good physical contact.

In another approach, appropriate for applications where particularly good electrical contact between the substrates is desired, the electrically insulating native oxide layers on substrates 160 and 160' may be first removed. This removal can be done, e.g., by etching, electro-polishing, sputtering, or shot blasting. Then metallic wetting layers 170 and 170', e.g., Ag, Cu, Ni, Ti, or TiN, are coated onto the respective back surfaces of substrates 160 and 160' to prevent the regrowth of the native oxide on the substrate surfaces. Additionally these wetting layers 170, 170' promote adhesion of the bonding layer to the substrate surface. Then solder adhesive layer 180 bonds the two assemblies together. Rigorous removal of the native oxide layer is not required, however, in order to achieve electrical contact between inserts. As is described in greater detail below, the electrical conductive material that optionally surrounds the multilayer HTS assembly can provide additional current sharing.

While the embodiment of FIG. 1 shows the use of solder and Ag wetting layers to bond the two substrates together, other adhesive schemes and materials can be used depending on the desired performance characteristics of the wire. In another approach, appropriate for applications where electrical isolation of the substrates from each other is desirable, adhesive layer 180 is for example a resin, epoxy, or other non-conductive material, and wetting layers 170 and 170' are selected to facilitate bonding between substrates 160, 160', and the non-conducting adhesive layer. In this case it may be that some of the layers are conductive, and other layers are non-conductive. In applications where the desired adhesive wets the back substrate surfaces, wetting layers 170 and 170' can be eliminated entirely. In this case, adhesive layer 180 directly contacts substrates 160 and 160'. In another approach, appropriate for applications where neither electrical communication nor adhesion between substrates 160 and 160' is needed, for example, in applications where the substantially sealing electrically conductive material provides sufficient structural integrity to the wire, wetting layers 170 and 170' as well as adhesive layer 180 can be eliminated, in which case, the back surfaces of substrates 160 and 160' are brought directly into contact with each other.

In the embodiment illustrated in FIG. 1, adhesive 180 bonds insert 110 to insert 120 at their respective substrates, creating HTS assembly 100. Cap layers 130 and 130' face outward in assembly 100, and substrates 160 and 160' are central to assembly 100. This configuration provides, for example, efficient electrical contact with an external current source, and efficient joining of lengths of superconductor wire. The outer surfaces of the assembly are electrically conductive cap layers 130 and 130'. These layers provide convenient electrically conductive paths to respective HTS layers 140 and 140'. In order to introduce current into the HTS layers, a connection between the current source and the assembly can be made anywhere on the outer surface of the assembly.

Figure 2A:
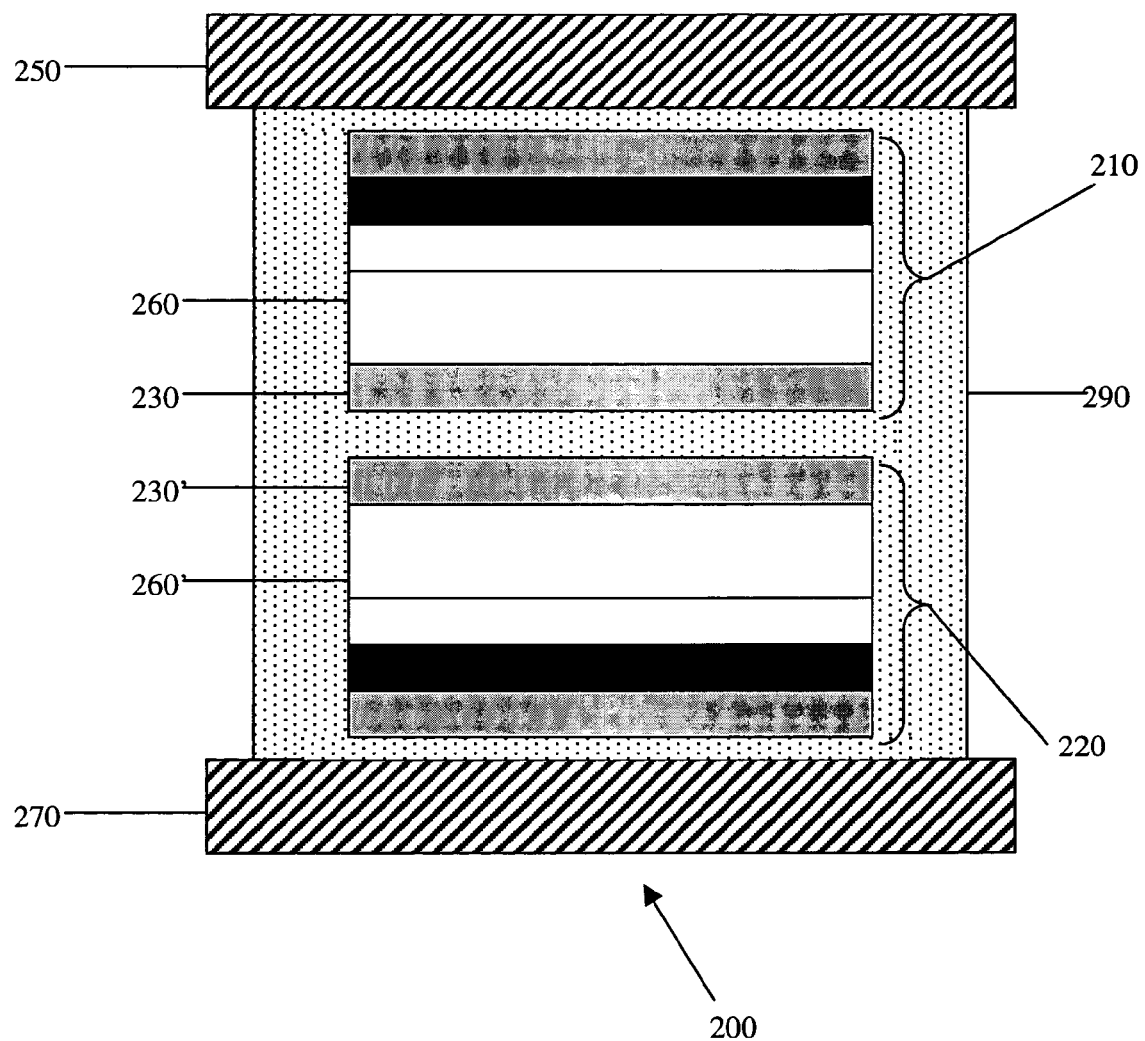
FIG. 2A shows a wire having HTS inserts that are bonded together and are laminated and sealed between two conductive stabilizer strips.

FIG. 2A illustrates an embodiment of the present invention, having a wire 200 that includes two bonded HTS inserts 210, 220, which may be the same as previously described, and a conductive outer structure. The conductive outer structure substantially surrounds and seals the wire from the environment, and provides electrical contact between the two HTS inserts as well as to an external electrical contact. The conductive outer structure further provides mechanical, thermal, and electrical stabilization to wire 200. The conductive outer structure includes upper and lower conductive stabilizer strips 250, 270 and electrically conductive non-porous filler material 290, e.g. solder or another low-melting temperature alloy or amalgam, a conductive polymer, or a pure metal such as In. Filler 290 substantially surrounds HTS inserts 210, 220 and also may serve as bonding layer 180, illustrated in the HTS assembly 100 of FIG. 1. As discussed previously, substrates 260, 260' may be coated with respective wetting layers 230, 230' to enhance their bonding to filler 290 (and to each other). Filler 290 also bonds inserts 210, 220 to conductive stabilizer strips 250, 270 at the outer surfaces of the HTS inserts. Filler 290 bridges strips 250, 270 in thick layers on the sides of the wire to thereby complete the isolation of the HTS assembly from the surrounding environment and to substantially completely surround the HTS assembly in a conductive structure.

Occasionally there can be a defect within an HTS layer, which causes a corresponding increase in the resistance of (and heating in) the layer during use of the wire. In this case it can be useful to divert, or shunt, some or all of the current into another HTS layer. This results in a more uniform conductor, with a conductivity that does not vary greatly along the length of the wire. This is of particular use when the operating current is well below the critical current, a common practice in the operation of superconducting devices. A two HTS layer structure using a single substrate, having two HTS layers that are coated on opposing sides of the substrate, has been contemplated as a method of implementing multiple HTS layers in a single wire in order to provide redundant superconducting pathways. However, this sort of structure suffers from having a very complicated manufacturing process with limited flexibility as to the electrical relationship between and composition of the two HTS layers. In contrast, the embodiments of the present invention, having two HTS inserts laminated together at their substrates, offer the benefits of ease of manufacturing, as well as ease of tailoring the structures to a particular desired application.

In wire 200, filler 290 provides electrical communication between the HTS inserts 210, 220. In essence filler 290 behaves as a conductive conduit, or bridge. Though filler 290 is conductive, as current flows through wire 200, the current will generally follow the path of least resistance, which is through one or both HTS inserts 210, 220. However if one of HTS inserts 210, 220 has a defect that increases its resistance in a certain region, the current can flow through filler 290 into the other HTS insert. Filler 290 has a higher resistance than HTS inserts 210, 220, so the current transfers between the inserts over some calculable length (e.g. a few centimeters) of the wire. The net result of the transfer is that the current can continue traveling along a low resistance path, i.e. through the other HTS insert. If there is a defect at a different region in this insert, then the current can transfer back to the other insert, which is unlikely to also have a defect in the same place. The presence of redundant electrical pathways for the current improves the electrical stability of the wire. The current capacity of wire 200 is much less sensitive to local defects in either of HTS inserts 210, 220 than it would be with a single insert, where the current would be forced through a high resistance section of the wire.

Providing electrical communication between HTS inserts 210, 220, with filler 290, also increases the current-carrying capacity of wire 200 over that of a single insert, or two isolated inserts. The critical current, Ic, and the engineering (total) critical current density, Je, are both increased. Filler 290 provides a means to introduce electrical current into one or both of HTS inserts 210, 220. By simply contacting a current source to filler 290, current flows via the filler into the HTS inserts. Because filler 290 is in contact with conductive stabilizer strips 250, 270, contacting a current source to one or both of strips 250, 270 also introduces current to one or both of HTS inserts 210, 220.

Material 290 is selected such that it is nonporous; in one or more embodiments, it is has sufficient strength and is coated with sufficient thickness to substantially surround and seal wire 200. This renders HTS inserts 210 and 220 substantially impervious to contamination by environmental factors, which can degrade the electrical performance of the inserts. Filler 290 may also substantially prevent infiltration of the assemblies by surrounding cryogenic fluid, which can form balloons that can potentially mechanically damage the HTS inserts. The thick coating of filler 290 on the sides of wire 200 also adds mechanical strength to the wire and may help to prevent delamination of wire 200 due to bending or other sources of potential damage. Material 290 adds thermal stability to the wire by providing additional heat capacity.

Stabilizer strips 250 and 270 further enhance the mechanical, electrical, and thermal stability of wire 200. Strips 250, 270 can be the same or different, depending upon the desired characteristics of the resulting wire. The thickness of the strips can be varied throughout a wide range of about 0.01-2 mm, depending upon the desired application. For superconducting cables, the thickness is typically between 0.05-0.075 mm. For a fault current limiter application, the stabilizer thickness can be as high as or higher than 1 mm. The material used for strips 250 and 270 is selected to provide an appropriate electrical, thermal, and mechanical stability to wire 200 for the desired application. Strips 250 and 270 are generally a flexible conductive material, e.g. metal, e.g. aluminum, copper, silver, nickel, iron, stainless steel, aluminum alloy, copper alloy, silver alloy, nickel alloy, nickel tungsten alloy, or iron alloy. For most applications, a high conductivity metal such as copper is preferred. For a fault current limiter application, a mechanically strong, high resistivity alloy such as stainless steel is preferred.

In some embodiments, stabilizer strips 250 and 270 have a width that is greater than the width of HTS inserts 210 and 220. This excess width, or overhang, allows layers or fillets of filler 290 to form along the sides of the wire by capillary action. In a preferred embodiment, the fillets have a concave profile relative to the edge of the wire. Because such fillets form by capillary action, the excess width of strips 250, 270 over the width of HTS assemblies 210, 220 determines the thickness of the fillet. Generally, the width of strips 250, 270 fall within the range of 0.01-2 mm greater than the width of HTS assemblies 210, 200. For example, stabilizer strips with a width of about 4.3 mm can be used with 4.0 or 4.1 mm wide superconducting inserts. Fillets can enhance the mechanical strength and durability of wire 200. A wider fillet enhances strength, but reduces the engineering critical current density. An optimally designed wire will have sufficient filler width to meet the mechanical specifications, but not much more. A typical individual fillet width ranges from 0.025-0.2 mm, but can be higher or lower (e.g. 0.005-1 mm) to meet specific strength or engineering critical current needs.

Among other reasons, thick fillets of filler 290 enhance the mechanical strength of wire 200 because substrates 260, 260' may not bond well to solder due to their oxidation during insert processing, as described previously. While wetting layers (e.g. 230, 230') can be deposited on the substrate surfaces to improve their bonding to solder, depositing such a coating on the sides of the wire, e.g., on the exposed edges of the multilayer HTS inserts 210, 220, may not be practical because of increased production cost. However, thick fillets of filler 290 can be deposited on the sides of wire 200, such that the filler adheres sufficiently to the other (non-substrate) layers of the multilayer assembly, and has sufficient strength, that it will not delaminate from the substrate sides. Some materials used as filler 290, e.g. Sn—Pb—Ag solders, strengthen considerably (up to three-fold) when cooled from room temperature to 77 K, and their contribution to the total strength can be significant.

By adjusting the overhang of stabilizer strips 250, 270 over HTS inserts 210, 220, the fillet can be made appropriately thick. As a typical example, the following wire can be illustrative: a 40 mm wide conductor is, after completion of all buffer and superconductor deposition/reaction steps, coated on both sides with a 0.003 mm thick Ag layer using sputter deposition. The 40 mm wide conductor is slit in a reel to reel fashion into eight 4.1 mm wide inserts. Each insert is laminated in a reel-to-reel lamination process to a 0.05×4.3 mm copper 155 stabilizer strip on both sides, using a Sn—Pb solder to which some Ag can be added. The resulting wire varies in width between 4.3-4.4 mm. The solder fillet width is about 0.15-0.2 mm on average.

Figure 2B:
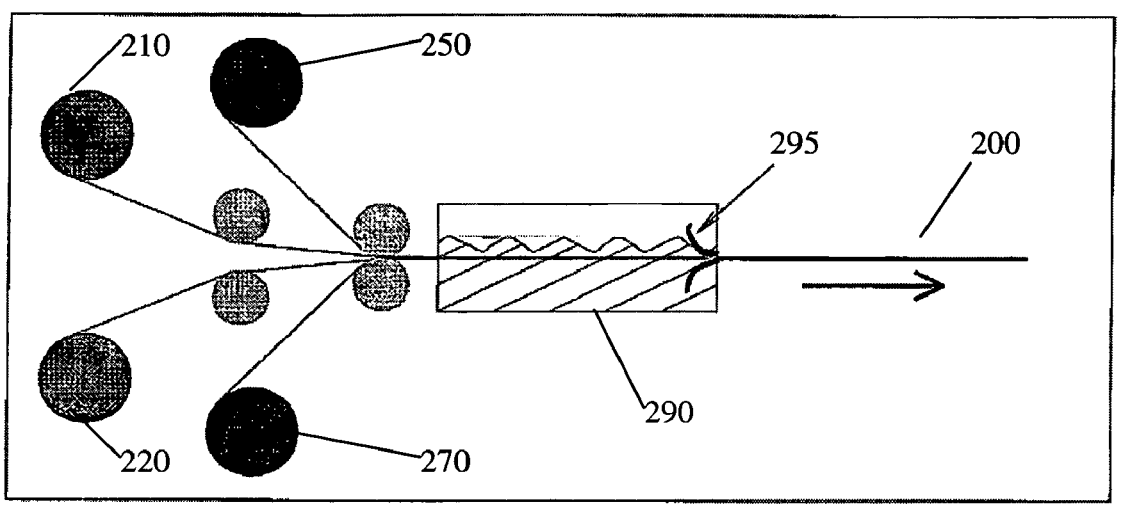
FIG. 2B shows a method of making a wire having HTS inserts that are bonded together and are laminated and sealed between two conductive stabilizer strips.

Wire 200 may be manufactured as illustrated in FIG. 2B. HTS wire inserts are fabricated as wide (e.g. about 4 to 10 cm wide) multilayer strips and then slit lengthwise into several narrow (e.g. about 10 strips of about 0.4 cm wide, from a 4 cm wide strip) strips, which form HTS inserts 210, 220. Conductive stabilizer strips 250, 270 may be wider than the width of the narrow HTS strip, so that the stabilizer strips overhang the HTS strip on both sides. After slitting, the wire is formed by joining narrow HTS insert strips 210, 220 with stabilizer strips 250, 270 in a bath of filler 290. Multilayer HTS inserts 210, 220, for example, may be fed into the filler bath from reels. Stabilizer strips 250, 270 may be fed off reels placed above and below the feed-in reels of HTS inserts 210, 220 so that the lengths of material form a stacked configuration. The filler simultaneously surrounds HTS inserts 210, 220 and also laminates them to the conductive stabilizer strips 250, 270. Die 295 merges and consolidates inserts 210, 220 and stabilizer strips 250, 270 into one superconducting wire 200. By laminating the stabilizer strips to the wire after fabricating and slitting the HTS inserts, the stabilizer strips can easily be made wider than the inserts. The overhanging feature promotes the capillary wicking of the solder between the upper and lower stabilizer strips 250, 270 to provide thick, mechanically robust fillets of filler 290 on the sides of the wire.

Figure 3A:
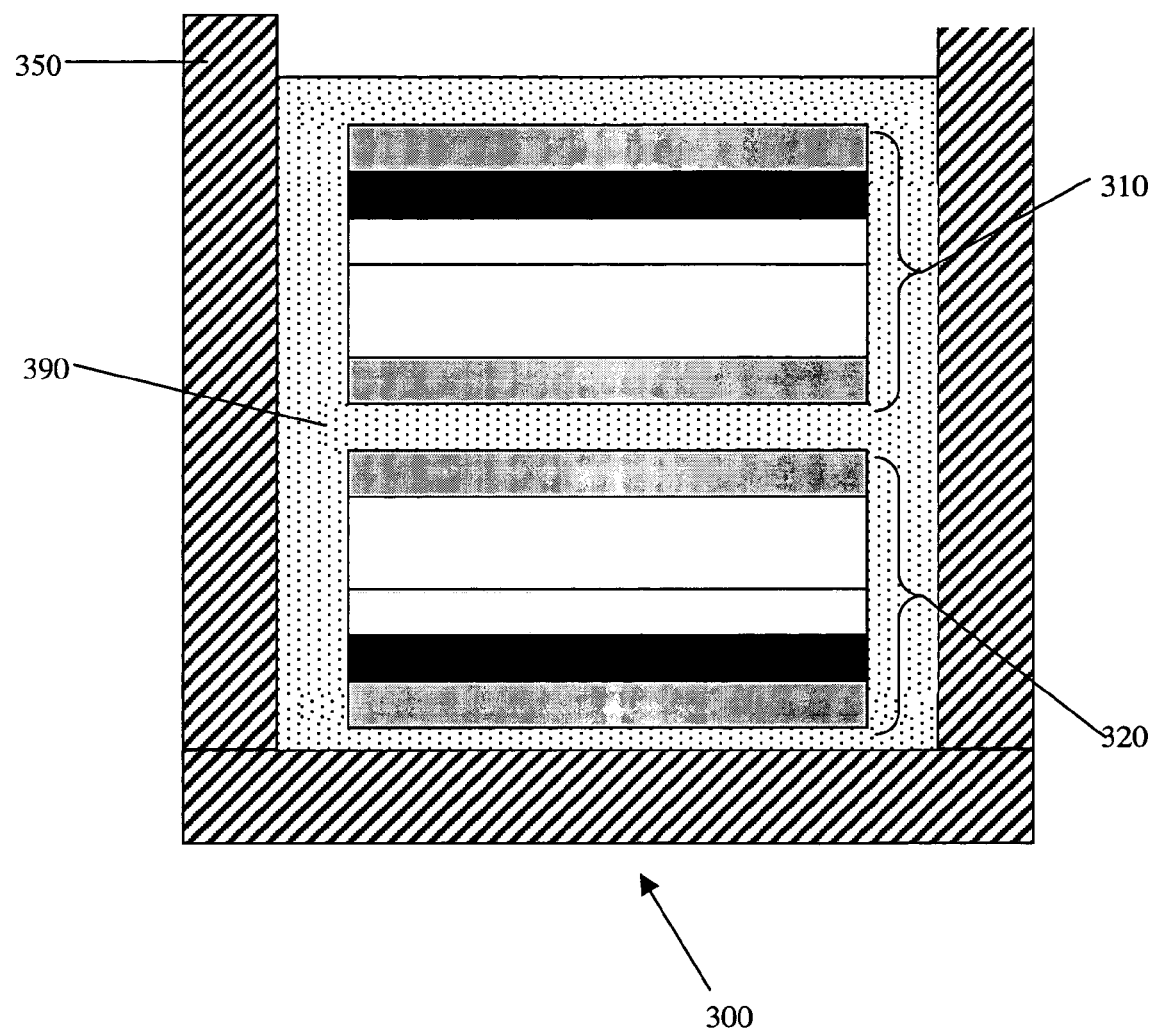
FIG. 3A shows a wire having two bonded HTS inserts that are sealed inside of a three-sided conductive trough.

FIG. 3A shows another embodiment of the present invention, having wire 300 that includes an HTS assembly including two bonded HTS inserts 310, 320, which may be the same as previously described, and a conductive outer structure. The conductive outer structure includes a first component 350 covering 3 sides of the HTS assembly, e.g., a three-walled trough, which can be assembled, a single part, or in a plurality of pieces, and electrically conductive non-porous filler 390. Filler 390, e.g., solder, surrounds inserts 310, 320 and bonds them together at their substrates as previously described. Filler 390 provides an electrical pathway between three-sided component 350 and HTS inserts 310, 320, and also between the inserts. Filler 390 seals inserts 310, 320 into three-sided component 350.

Three-sided component 350 is made from a flexible conductive material, e.g. metal, e.g. aluminum, copper, silver, nickel, iron, stainless steel, aluminum alloy, copper alloy, silver alloy, nickel alloy, nickel tungsten alloy, or iron alloy. As described above for stabilizer strips 250 and 270 in FIG. 2A, the material for three-sided component 350 is selected to provide electrical, thermal, and mechanical stability to the wire for the desired application. The walls of the three-sided component can have a thickness between, for example, 0.0001-0.5 mm, and can be thicker depending on the desired application (e.g. 0.0001-1 mm). Three-sided component 350 has a width that is wider than inserts 310 and 320, and a depth that is deeper than the thickness of the HTS assembly. This allows for a sufficiently thick layer of filler 390 to substantially surround the assembly on all sides and to substantially seal wire 300. Wire 300 is manufactured by first providing HTS inserts 310, 320, which can be slit from wide strips as described previously. Then in a bath of filler 390, e.g. solder, inserts 310, 320 are simultaneously bonded together, surrounded by filler 390, inserted into three-sided component 350, and sealed into the three-sided component.

Figure 3B:
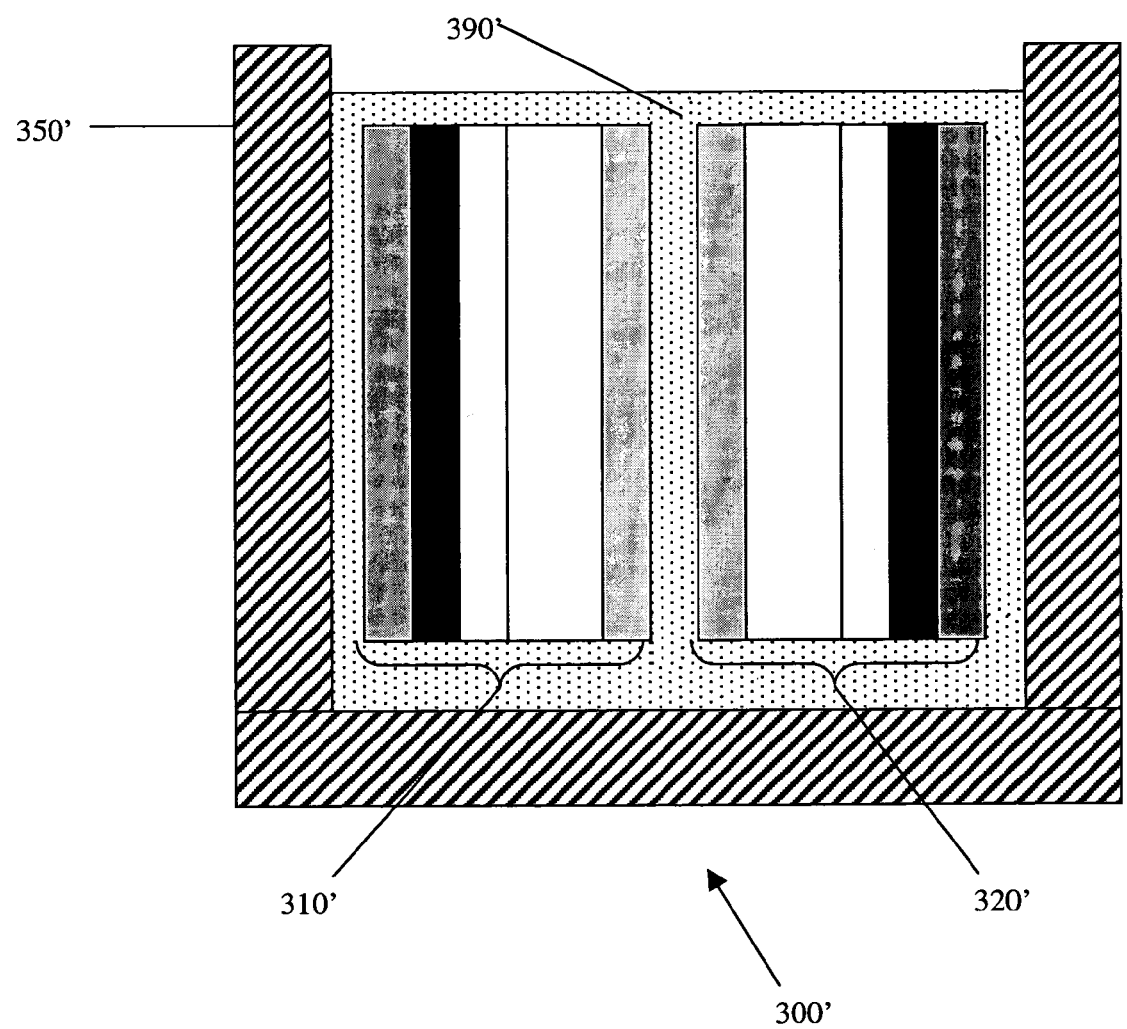
FIG. 3B shows a wire having an alternate arrangement of two bonded HTS inserts that are sealed inside of a three-sided conductive trough.

FIG. 3B shows a wire having an alternate arrangement of two bonded HTS inserts 310', 320', which may be the same as previously described, that are sealed inside of three-sided component 350'. Electrically conductive non-porous filler 390', e.g., solder, substantially surrounds inserts 310' and 320' and bonds them together at their substrates. Filler 390' provides an electrical pathway to and between HTS inserts 310', 320'. Filler 390' seals inserts 310', 320' into three-sided component 350', which may be the same as described previously. In this wire three-sided component 350' has a width that is wider than the thickness of the assembly, and a depth that is deeper than the width of the assembly. This allows for a sufficiently thick layer of filler 390' to substantially surround the assembly on all sides and to substantially seal wire 300'. Wire 300' may be manufactured as described for FIG. 3A.

Figure 4A:
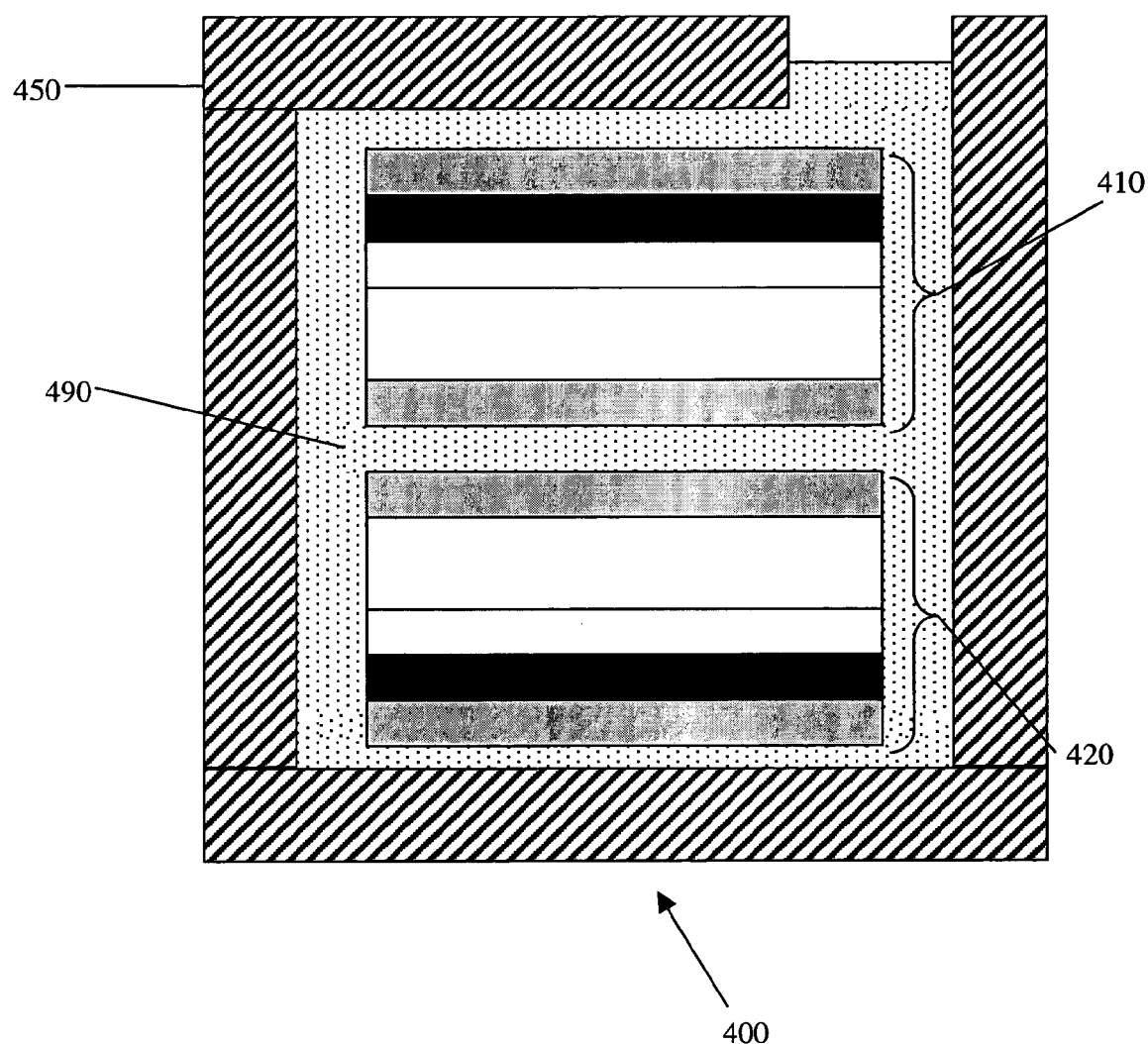
FIG. 4A shows a wire having two bonded HTS inserts that are sealed inside of a four-sided conductive structure.

FIG. 4A shows a wire 400 having HTS inserts 410, 420, which may be the same as previously described, that are sealed inside of a four-walled structure 450, which may provide additional mechanical stability over the three-walled trough of FIGS. 3A and 3B. Electrically conductive non-porous filler 490, e.g., solder, surrounds inserts 410, 420 and bonds them together at their substrates as previously described. Filler 490 provides an electrical pathway to and between HTS inserts 410, 420. Filler 490 seals inserts 410, 420 into four-walled structure 450. The internal dimensions of structure 450 are larger than the appropriate dimensions of bonded HTS inserts 410 and 420. This allows for a sufficiently thick layer of solder to substantially surround the inserts on all sides and substantially seal wire 400. Wire 400 can manufactured by first providing the HTS inserts, which can be slit from wide strips as described previously. One of the walls of structure 450 is left open in order to leave an adequate space to receive HTS inserts 410 and 420. In a solder bath, the inserts are then simultaneously inserted into structure 450, bonded together, and surrounded by solder. The open wall of structure 450 is then mechanically folded over, enclosing the inserts and solder. Solder fills the gap left from the fold, as can be seen in the figure.

Figure 4B:
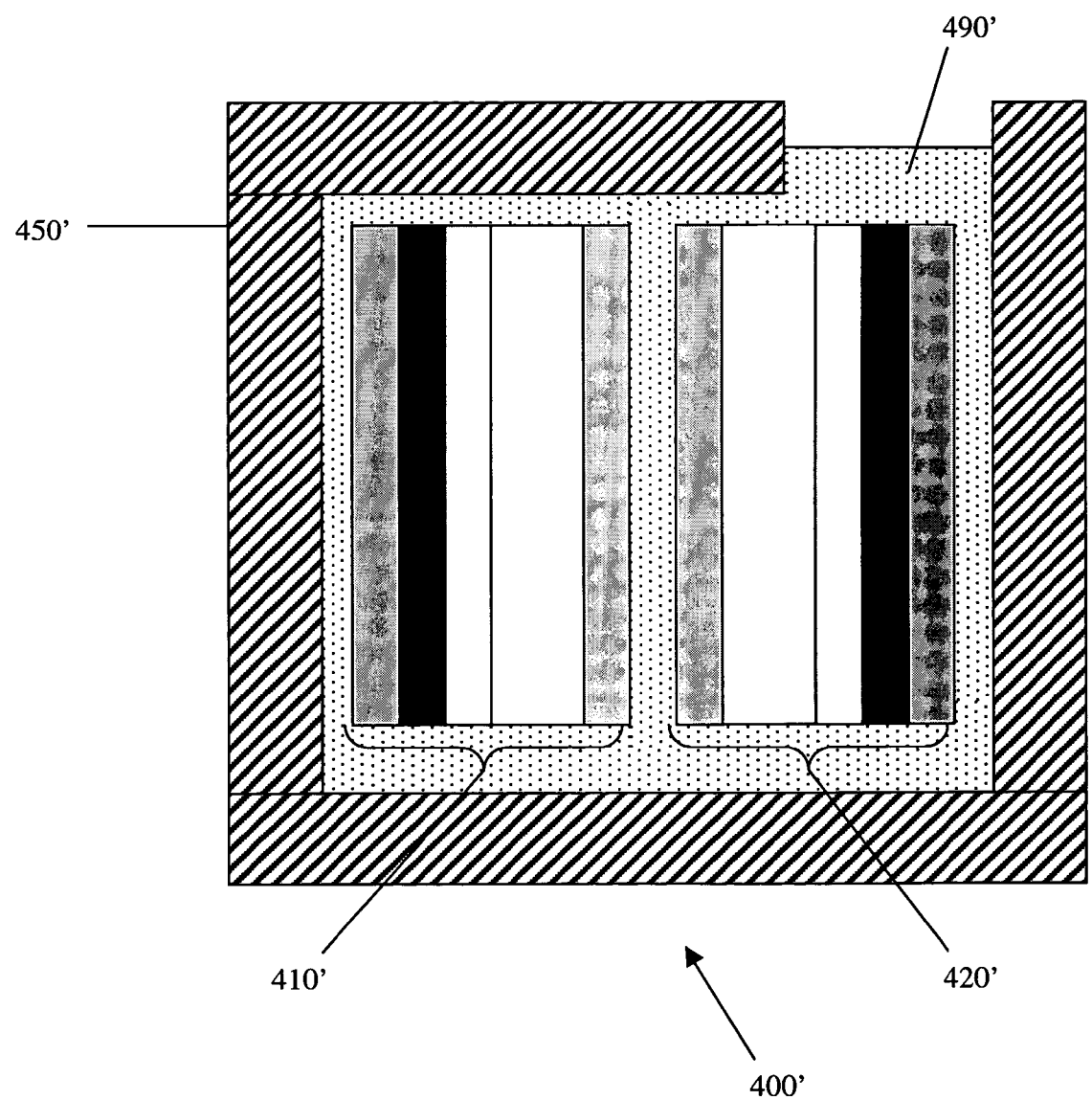
FIG. 4B shows a wire having an alternate arrangement of two bonded HTS inserts that are sealed inside of a four-sided conductive structure.

FIG. 4B shows a wire 400' having an alternate arrangement of two bonded HTS inserts 410', 420', which may be the same as previously described, that are sealed inside of four-walled structure 450'. Electrically conductive non-porous filler 490', e.g., solder, surrounds inserts 410', 420' and bonds them together at their substrates as previously described. Filler 490' provides an electrical pathway to and between HTS inserts 410', 420'. Filler 490' seals inserts 410', 420' into four-walled structure 450'. The internal dimensions of structure 450' are larger than the appropriate dimensions of bonded HTS inserts 410', 420'. This allows for a sufficiently thick layer of solder to surround the inserts on all sides and seal the structure. Wire 400' may be manufactured as described for FIG. 4A.

Figure 5A:
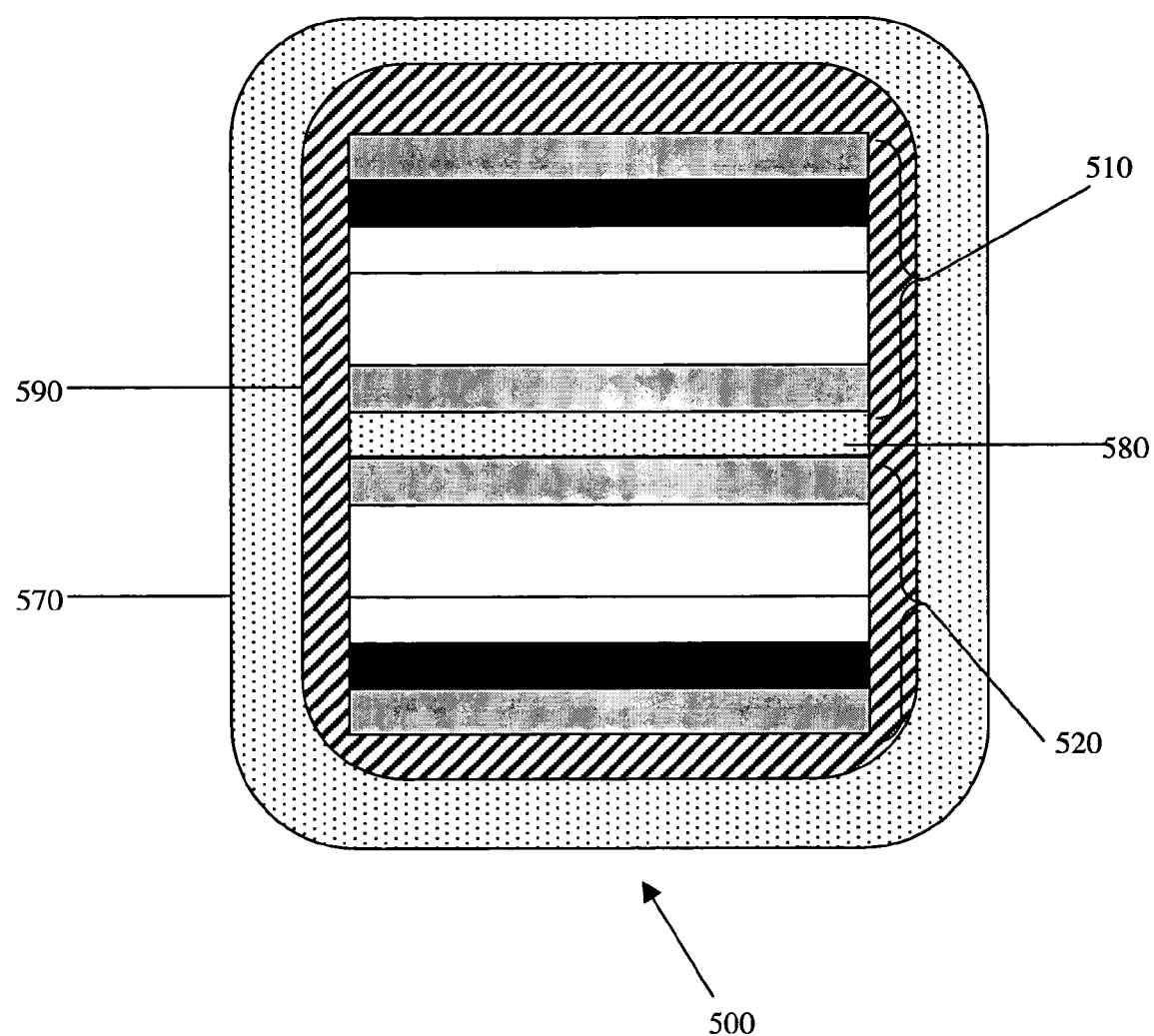
FIG. 5A shows a cross sectional view of a wire having two bonded HTS inserts that are wrapped with conductive foil and then coated with solder.
Figure 5B:
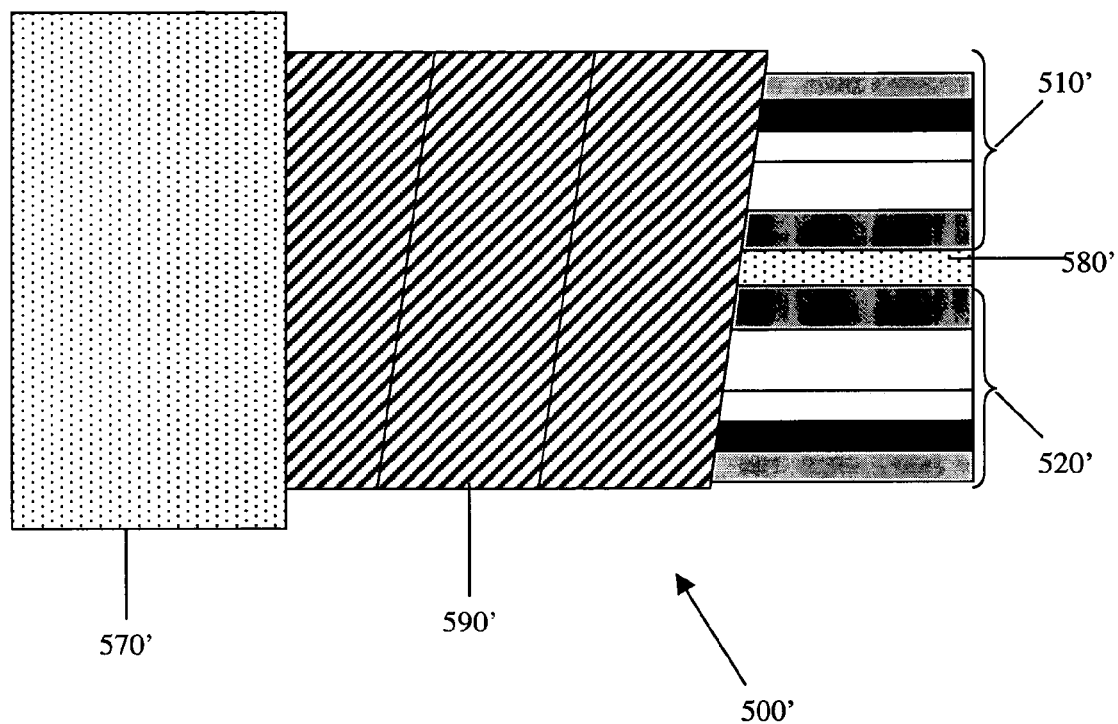
FIG. 5B shows a lengthwise view of a wire having two bonded HTS inserts that are wrapped with conductive foil and then coated with solder.

In another embodiment, shown in different perspectives in FIGS. 5A and 5B, a thin conductive foil is wrapped around an HTS assembly. In cross-sectional view FIG. 5A, adhesive 580 bonds together HTS inserts 510, 520, which may be the same as previously described. Conductive foil 590 is tightly and contiguously wrapped around the bonded inserts. This places foil 590 in good electrical contact with inserts 510, 520, and provides a route for electrical communication between the inserts. As can be seen in FIG. 5B, each consecutive wrap of foil 590' around inserts 510', 520' overlaps with the previous wrap, providing a seal around the wire. The thickness of the foil can be varied in a wide range, depending on the application, for example between 0.0001-0.5 mm. Substantially nonporous sealer 570 is coated on top of foil 590. Sealer 570 can be a electrically conductive material, in which case sealer 570 and foil 590 together provide an electrical pathway from the outside of the wire to HTS inserts 510, 520. In another embodiment, sealer 570 can be a substantially nonporous non-conductive material, in which case the exterior of wire 500 is electrically insulated. In this case to make a conductive connection from the outside of wire 500 to HTS inserts 510, 520, sealer 570 must be stripped away. This allows access to conductive foil 590, which is in electrical contact with HTS inserts 510, 520. Wire 500 can be manufactured by providing and bonding HTS inserts 510, 520 as described previously, and then mechanically wrapping conductive foil 590 around the resulting assembly. Then wire 500 can be run through a bath of sealer 570, e.g. solder, which substantially surrounds and seals wire 500.

Figure 6:
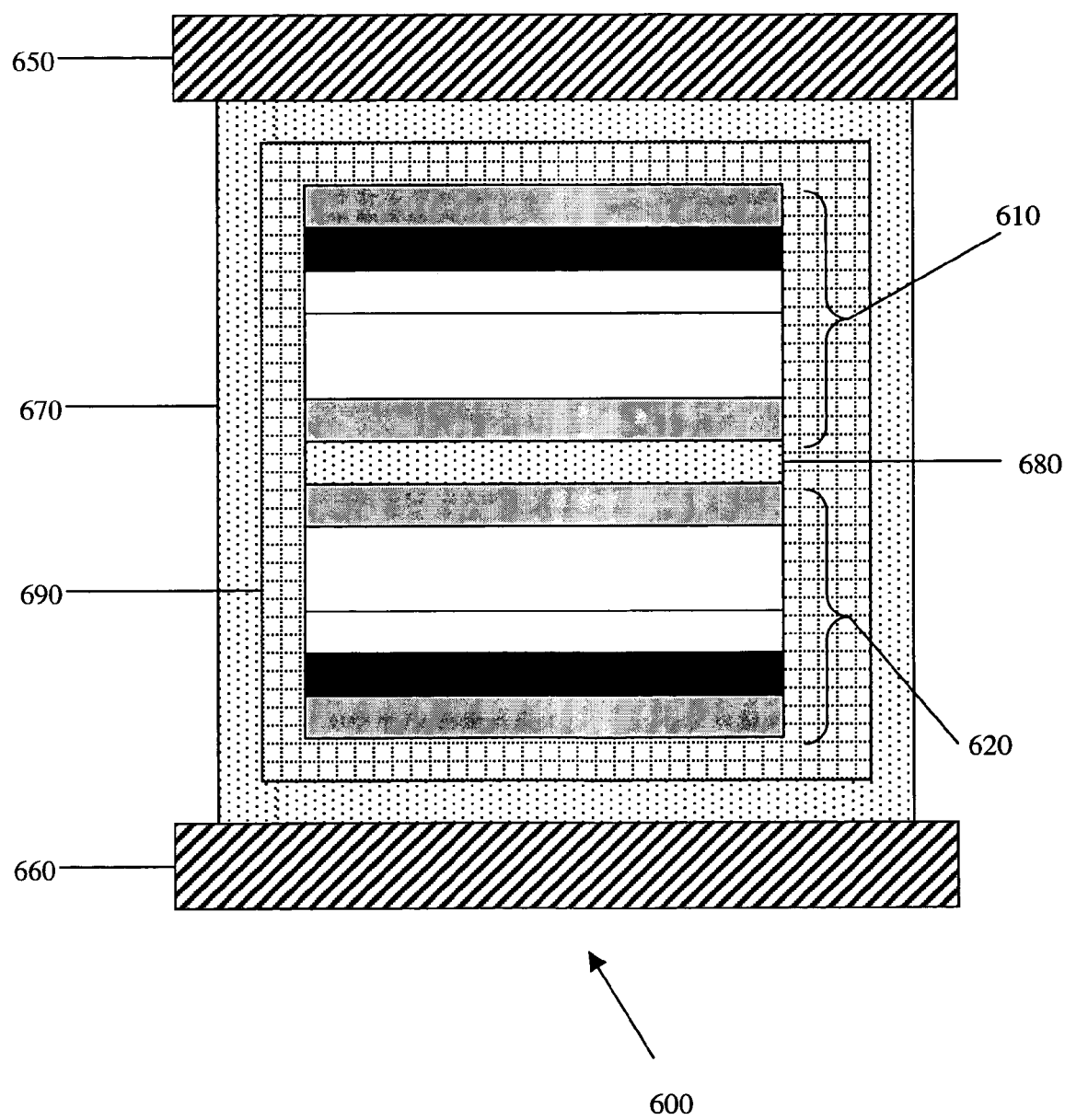
FIG. 6 shows a wire having two bonded HTS inserts that are electroplated with metal and then laminated and sealed between two conductive stabilizer strips.

In another embodiment, shown in FIG. 6, wire 600 includes two HTS inserts 610, 620, which are bonded with adhesive 680 and may be the same as described previously, layer 690, and a two-tape structure like that shown in FIG. 2A. Layer 690 substantially surrounds and provides electrical contact between 610, 620, 680. Layer 690 is, for example, a metallic coating that is deposited onto assembly 610, 620, 680. Cu, Ag, Ti, TiN, and Sn are examples of metals that can be deposited onto the assembly. Alternately, layer 690 is e.g, a coating of a conductive polymer, a polymer containing metallic powder, or conductive glue, to result in a conductive medium. Whatever the chosen coating, conductive stabilizer strips 650, 660 are laminated to the assembly with filler 670 as described for the wire shown in FIG. 2. Filler 670 may be the same as described for FIG. 2. Stabilizer strips 650, 660, along with filler 670, provide structural, thermal, and electrical integrity to wire 600 beyond that provided by layer 690. Because wire 600 contains many features that enhance its strength and durability, it is useful for applications with harsh environmental conditions or excessive mechanical stress. The coated assembly 610, 620, 680, 690 can also be inserted in any of the above-described embodiments, for applications requiring additional stability.

Figure 7:
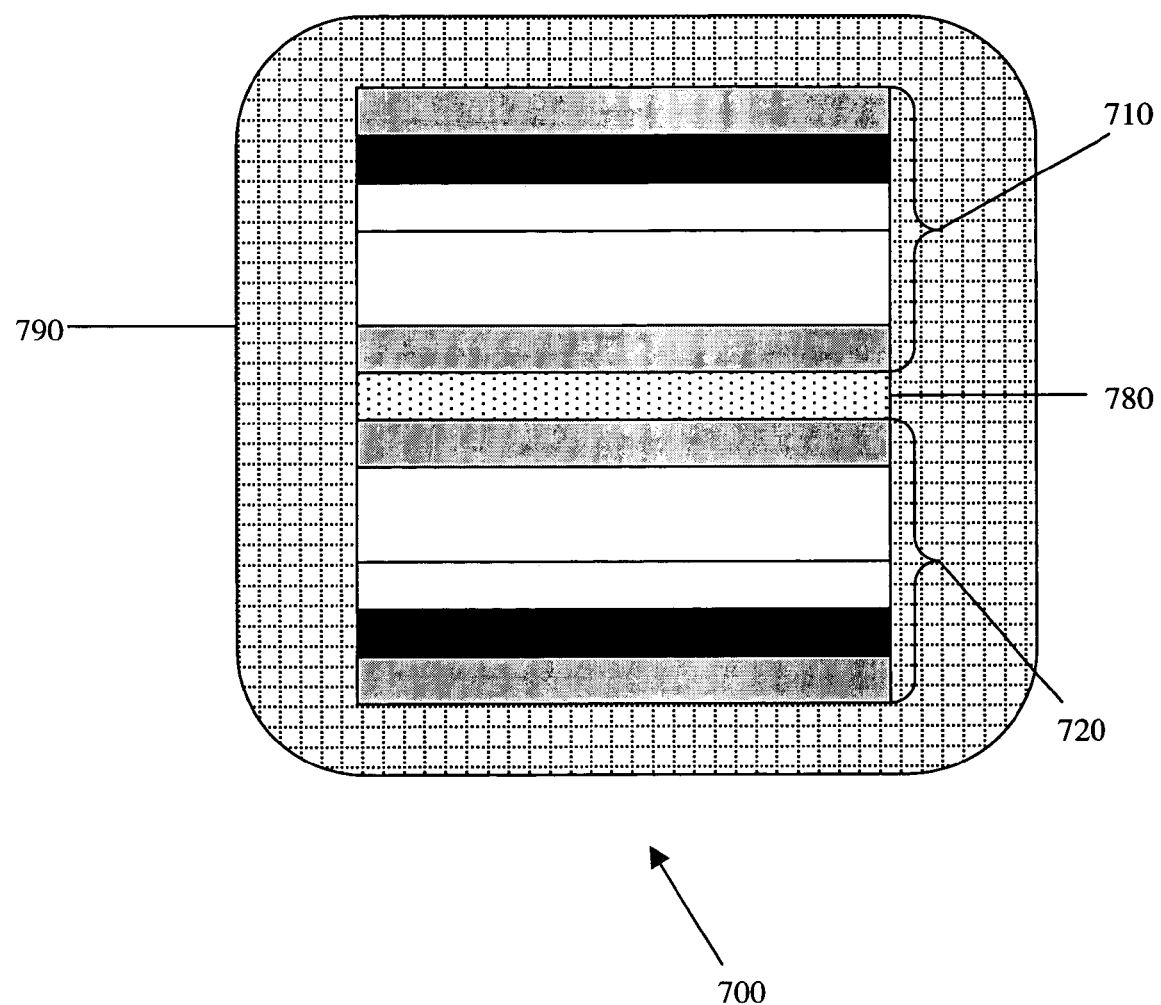
FIG. 7 is a cross-sectional illustration of another embodiment of the present invention, showing a wire having two HTS inserts that are bonded at their substrates, and are sealed inside of an electrically conductive structure.

In one or more embodiments of the present invention, as illustrated in FIG. 7, a wire includes two HTS inserts 710, 720, which are bonded with adhesive 780 and may be the same as described previously, and an electrically conductive layer 790. Layer 790 may substantially surround and seal the HTS assembly 710, 720, 780. Layer 790 provides electrical communication between HTS inserts 710, 720. Layer 790 can be a deposited metal coating. The metal can be deposited by an electroplating process, by a metal powder sintering process, or by an electroless plating process. Electroplating, powder sintering, and electroless plating methods are well known. Cu, Ag, Ti, TiN, and Sn are examples of metals that can be deposited onto assembly 710, 720, 780. In other embodiments, layer 790 is a conductive polymer, or a polymer containing metallic powder. Polymer coatings can be applied through a reel-to-reel dip coating and curing process, with dies or wipes in-line to control the polymer layer thickness. Still other kinds of conductive materials can be used for layer 790. These materials have the property of providing good electrical contact between HTS inserts 710, 720 and/or between HTS inserts 710, 720 and an external conductive contact. These materials also can be substantially nonporous, and can be deposited with a thickness sufficient to substantially surround and seal the resulting wire 700.

While the embodiments described above are wires that include HTS inserts that are bonded together by their substrates, and inserted inside of different kinds of outer structures, other HTS assemblies can be contemplated for use in any of the described wires. For example, in one or more embodiments the coated wire 700 of FIG. 7 can itself be inserted into one or more of the described outer conductive structures.

Figure 8:
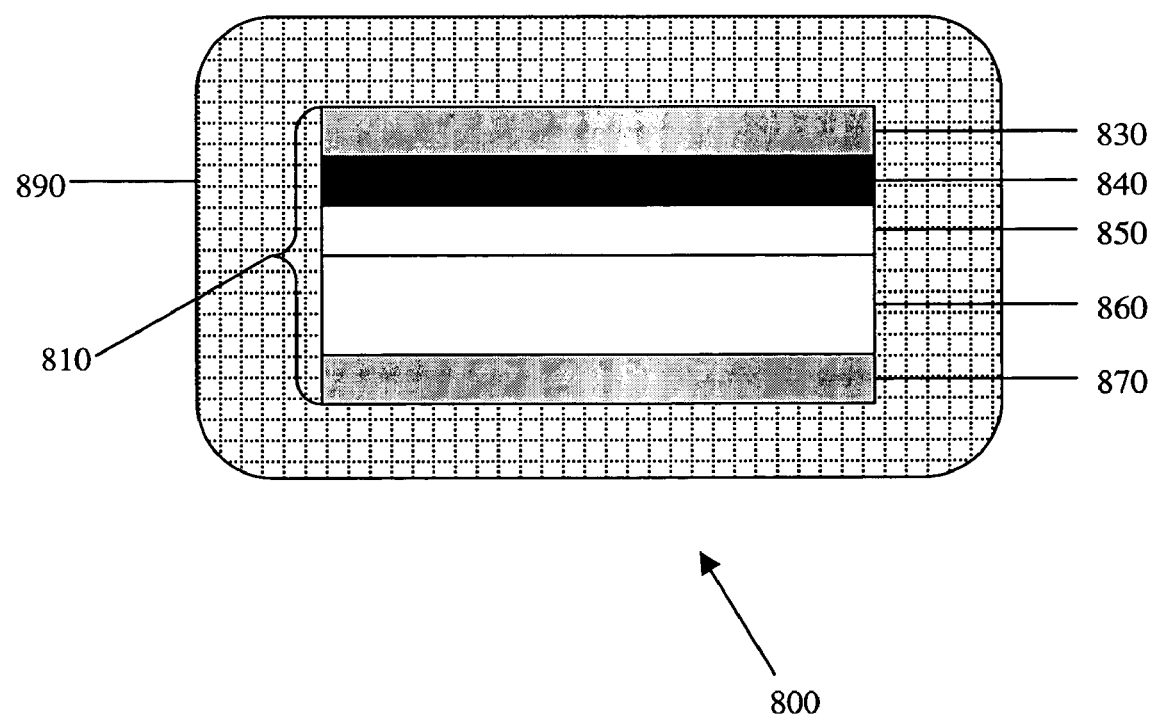
FIG. 8 is a cross-sectional illustration of another embodiment of the present invention, showing a wire having a single HTS insert and a wetting layer, and sealed inside of an electrically conductive structure.

The novel wetting layers described herein that are used in conjunction with multiple HTS inserts can also be used to prepare single HTS inserts having an electrically conductive outer structure. In one or more embodiments, a single HTS assembly can be inserted into one or more of the above described outer structures. Referring to FIG. 8, wire 800 includes an HTS insert 810 that may be the same as described previously. Wire 800 also includes an outer structure 890, where outer structure 890 represents the outer conductive structure of any of the embodiments illustrated in FIGS. 2-7. HTS insert 810 includes substrate 860, buffer layer 850, HTS layer 840, and cap layer 830, which may have the same components and characteristics as insert 110 in the configuration shown in FIG. 1. Insert 810 also has a wetting layer 870 that is deposited on substrate 860. In this case wetting layer 870 is selected such that it allows for good adhesion between substrate 860 and outer structure 890. Outer structure 890 is in electrical contact with HTS layer 840. Thus by simply contacting a current source to outer structure 890, current will flow into the HTS layer. Outer structure 890 substantially surrounds and seals HTS insert 810.

While the described wires contain HTS inserts and assemblies having a substrate, one or more buffer layer (s), rare earth oxide superconductor, and cap layer, the wires are not constrained to using these specific kinds of superconductor inserts or assemblies. Any kind of HTS assembly can be used, provided that it contains an HTS layer. For example, a mesh-type stabilizer having low conductivity in the weft (perpendicular to the wire axis) and high conductivity in the warp (along the wire axis) can be used in place of conductive stabilizer strips. This type of stabilizer has the advantage of reducing eddy current losses in alternating current applications. Further details of appropriate mesh-type stabilizers may be found in commonly-owned U.S. patent application, U.S. Ser. No. 60/667,001, entitled "Mesh-Type Stabilizer for Filamentary Coated Superconductors," which is hereby incorporated in its entirety by reference.

Figure 9:
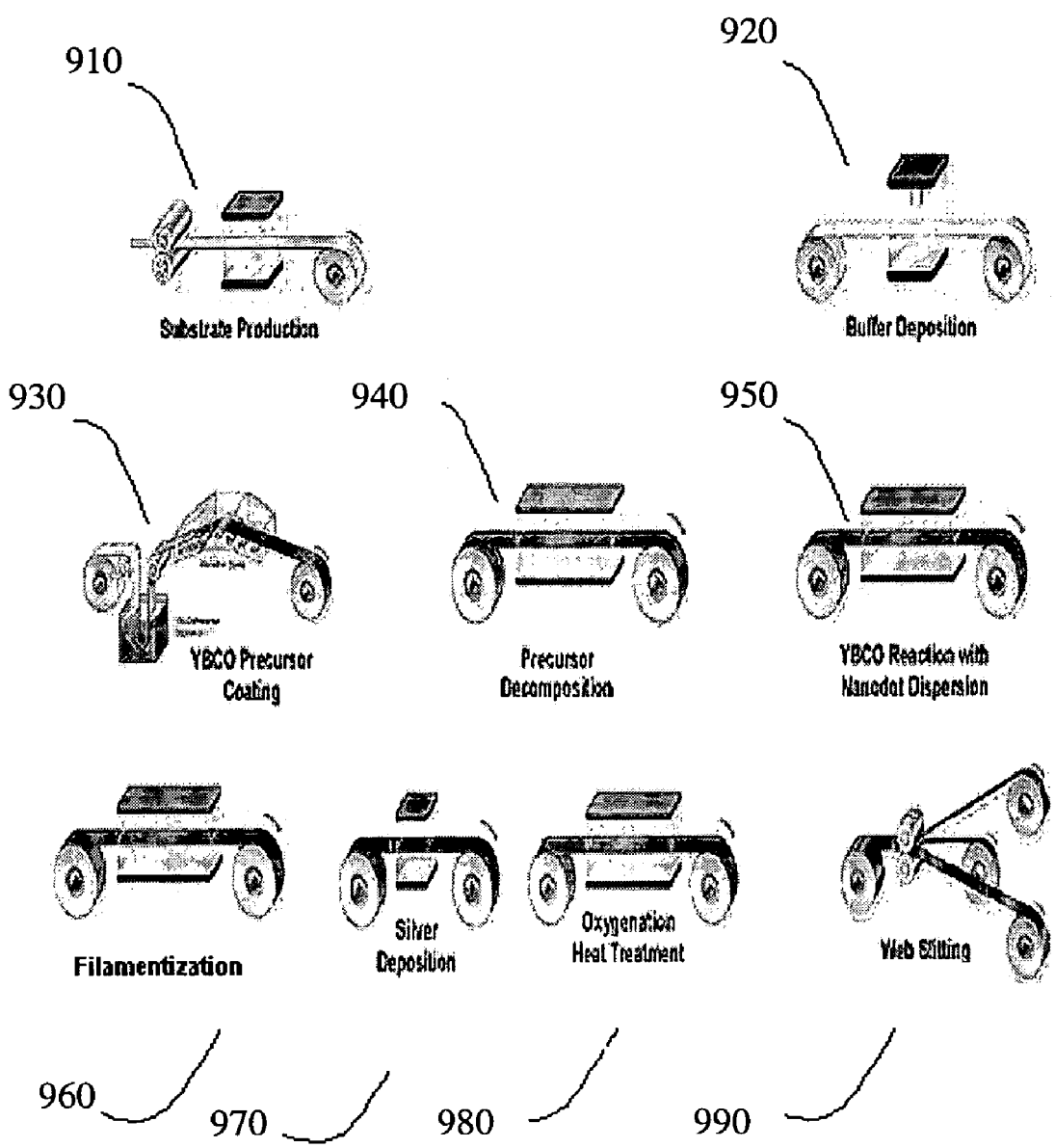
FIG. 9 illustrates a flow diagram of an exemplary process used to manufacture an HTS insert.

FIG. 9 illustrates a flow diagram of an exemplary process used to manufacture an HTS wire according to various embodiments of the present invention. At a first station 910, a wire substrate is treated to obtain biaxial texture. Preferably, the substrate surface has a relatively well defined crystallographic orientation. For example, the surface can be a biaxially textured surface (e.g., a (113)[211] surface) or a cube textured surface (e.g., a (100)[011] surface or a (100)[001] surface). Preferably, the peaks in an X-ray diffraction pole figure of the surface have a FWHM of less than about 20° (e.g., less than about 15°, less than about 10°, or from about 5° to about 10°).

The surface can be prepared, for example, by rolling and annealing. Surfaces can also be prepared using vacuum processes, such as ion beam assisted deposition, inclined substrate deposition and other vacuum techniques known in the art to form a biaxially textured surface on, for example, a randomly oriented polycrystalline or amorphous surface. In certain embodiments (e.g., when ion beam assisted deposition is used), the surface of the substrate need not be textured (e.g., the surface can be randomly oriented polycrystalline, or the surface can be amorphous).

The substrate can be formed of any material capable of supporting a buffer layer stack and/or a layer of superconductor material, and capable of providing the mechanical properties required for the final wire. Examples of substrate materials that can be used as the substrate include for example, metals and/or alloys, such as nickel, silver, copper, zinc, aluminum, iron, chromium, vanadium, palladium, molybdenum and/or their alloys. In some embodiments, the substrate can be formed of a superalloy. In certain embodiments, the substrate can be in the form of an object having a relatively large surface area (e.g., a wire or a wafer). In these embodiments, the substrate is preferably formed of a relatively flexible material.

In some of these embodiments, the substrate is a binary alloy that contains two of the following metals: copper, nickel, chromium, vanadium, aluminum, silver, iron, palladium, molybdenum, tungsten, gold and zinc. For example, a binary alloy can be formed of nickel and chromium (e.g., nickel and at most 20 atomic percent chromium, nickel and from about five to about 18 atomic percent chromium, or nickel and from about 10 to about 15 atomic percent chromium). As another example, a binary alloy can be formed of nickel and copper (e.g., copper and from about five to about 45 atomic percent nickel, copper and from about 10 to about 40 atomic percent nickel, or copper and from about 25 to about 35 atomic percent nickel). As a further example, a binary alloy can contain nickel and tungsten (e.g., from about one atomic percent tungsten to about 20 atomic percent tungsten, from about two atomic percent tungsten to about 10 atomic percent tungsten, from about three atomic percent tungsten to about seven atomic percent tungsten, about five atomic percent tungsten). A binary alloy can further include relatively small amounts of impurities (e.g., less than about 0.1 atomic percent of impurities, less than about 0.01 atomic percent of impurities, or less than about 0.005 atomic percent of impurities). Ni—5 wt. % W is a preferred material for the substrate.

In certain of these embodiments, the substrate contains more than two metals (e.g., a ternary alloy or a quarternary alloy). In some of these embodiments, the alloy can contain one or more oxide formers (e.g., Mg, Al, Mo, V, Ta, Ti, Cr, Ga, Ge, Zr, Hf, Y, Si, Pr, Eu, Gd, Tb, Dy, Ho, Lu, Th, Er, Tm, Be, Ce, Nd, Sm, Yb and/or La, with Al being the preferred oxide former), as well as two of the following metals: copper, nickel, chromium, tungsten, vanadium, aluminum, silver, iron, palladium, molybdenum, gold and zinc. In certain of these embodiments, the alloy can contain two of the following metals: copper, nickel, chromium, tungsten, vanadium, aluminum, silver, iron, palladium, molybdenum, gold and zinc, and can be substantially devoid of any of the aforementioned oxide formers.

In embodiments in which the alloys contain an oxide former, the alloys can contain at least about 0.5 atomic percent oxide former (e.g., at least about one atomic percent oxide former, or at least about two atomic percent oxide former) and at most about 25 atomic percent oxide former (e.g., at most about 10 atomic percent oxide former, or at most about four atomic percent oxide former). For example, the alloy can include an oxide former (e.g., at least about 0.5 aluminum), from about 25 atomic percent to about 55 atomic percent nickel (e.g., from about 35 atomic percent to about 55 atomic percent nickel, or from about 40 atomic percent to about 55 atomic percent nickel) with the balance being copper. As another example, the alloy can include an oxide former (e.g., at least about 0.5 atomic aluminum), from about five atomic percent to about 20 atomic percent chromium (e.g., from about 10 atomic percent to about 18 atomic percent chromium, or from about 10 atomic percent to about 15 atomic percent chromium) with the balance being nickel. The alloys can include relatively small amounts of additional metals (e.g., less than about 0.1 atomic percent of additional metals, less than about 0.01 atomic percent of additional metals, or less than about 0.005 atomic percent of additional metals).

A substrate formed of an alloy can be produced by, for example, combining the constituents in powder form, melting and cooling or, for example, by diffusing the powder constituents together in solid state. The alloy can then be formed by deformation texturing (e.g, annealing and rolling, swaging, extrusion and/or drawing) to form a textured surface (e.g., biaxially textured or cube textured). Alternatively, the alloy constituents can be stacked in a jelly roll configuration, and then deformation textured. In some embodiments, a material with a relatively low coefficient of thermal expansion (e.g, Nb, Mo, Ta, V, Cr, Zr, Pd, Sb, NbTi, an intermetallic such as NiAl or $Ni_3Al$, or mixtures thereof) can be formed into a rod and embedded into the alloy prior to deformation texturing.

In some embodiments, stable oxide formation at the surface can be mitigated until a first epitaxial (for example, buffer) layer is formed on the biaxially textured alloy surface, using an intermediate layer disposed on the surface of the substrate. Intermediate layers include those epitaxial metal or alloy layers that do not form surface oxides when exposed to conditions as established by $PO_2$ and temperature required for the initial growth of epitaxial buffer layer films. In addition, the buffer layer acts as a barrier to prevent substrate element(s) from migrating to the surface of the intermediate layer and forming oxides during the initial growth of the epitaxial layer. Absent such an intermediate layer, one or more elements in the substrate would be expected to form thermodynamically stable oxide(s) at the substrate surface which could significantly impede the deposition of epitaxial layers due to, for example, lack of texture in this oxide layer.

Exemplary intermediate metal layers include nickel, gold, silver, palladium, and alloys thereof. Additional metals or alloys may include alloys of nickel and/or copper. Epitaxial films or layers deposited on an intermediate layer can include metal oxides, chalcogenides, halides, and nitrides. In some embodiments, the intermediate metal layer does not oxidize under epitaxial film deposition conditions.

Care should be taken that the deposited intermediate layer is not completely incorporated into or does not completely diffuse into the substrate before nucleation and growth of the initial buffer layer structure causes the epitaxial layer to be established. This means that after selecting the metal (or alloy) for proper attributes such as diffusion constant in the substrate alloy, thermodynamic stability against oxidation under practical epitaxial buffer layer growth conditions and lattice matching with the epitaxial layer, the thickness of the deposited metal layer has to be adapted to the epitaxial layer deposition conditions, in particular to temperature.

Deposition of the intermediate metal layer can be done in a vacuum process such as evaporation or sputtering, or by electrochemical means such as electroplating (with or without electrodes). These deposited intermediate metal layers may or may not be epitaxial after deposition (depending on substrate temperature during deposition), but epitaxial orientation can subsequently be obtained during a post-deposition heat treatment.

In certain embodiments, sulfur can be formed on the surface of the substrate or intermediate layer. The sulfur can be formed, for example, by exposing the intermediate layer to a gas environment containing a source of sulfur (e.g., $H_2S$, a tantalum foil or a silver foil) and hydrogen (e.g., hydrogen, or a mix of hydrogen and an inert gas, such as a 5% hydrogen/ argon gas mixture) for a period of time (e.g., from about 10 seconds to about one hour, from about one minute to about 30 minutes, from about five minutes to about 15 minutes). This can be performed at elevated temperature (e.g., at a temperature of from about 450° C. to about 1100° C., from about 600° C. to about 900° C., 850° C.). The pressure of the hydrogen (or hydrogen/inert gas mixture) can be relatively low (e.g., less than about one torr, less than about $1\times10^{-3}$ torr, less than about $1\times10^{-6}$ torr) or relatively high (e.g., greater than about 1 torr, greater than about 100 torr, greater than about 760 torr).

Without wishing to be bound by theory, it is believed that exposing the textured substrate surface to a source of sulfur under these conditions can result in the formation of a superstructure (e.g., a c(2×2) superstructure) of sulfur on the textured substrate surface. It is further believed that the superstructure can be effective in stabilizing (e.g., chemically and/or physically stabilizing) the surface of the intermediate layer.

While one approach to forming a sulfur superstructure has been described, other methods of forming such superstructures can also be used. For example, a sulfur superstructure (e.g., S c(2×2)) can be formed by applying an appropriate organic solution to the surface of the intermediate layer by heating to an appropriate temperature in an appropriate gas environment. Moreover, while formation of a sulfur superstructure on the surface of the intermediate layer has been described, it is believed that other superstructures may also be effective in stabilizing (e.g., chemically and/or physically stabilizing) the surface. For example, it is believed that an oxygen superstructure, a nitrogen superstructure, a carbon superstructure, a potassium superstructure, a cesium superstructure, a lithium superstructure or a selenium superstructure disposed on the surface may be effective in enhancing the stability of the surface.

In a second processing station 920, a buffer layer is formed on the textured substrate by epitaxial growth on a textured metal surface. Alternatively, a buffer layer can be formed on a polycrystalline, randomly textured metal surface using ion beam assisted deposition (IBAD). In this technique, a buffer layer material is evaporated using, for example, electron beam evaporation, sputtering deposition, or pulsed laser deposition while an ion beam (e.g., an argon ion beam) is directed at a smooth amorphous surface of a substrate onto which the evaporated buffer layer material is deposited.

For example, the buffer layer can be formed by ion beam assisted deposition by evaporating a buffer layer material having a rock-salt like structure (e.g., a material having a rock salt structure, such as an oxide, including MgO, or a nitride) onto a smooth, amorphous surface (e.g., a surface having a root mean square roughness of less than about 100 Angstroms) of a substrate so that the buffer layer material has a surface with substantial alignment (e.g., about 13° or less), both in-plane and out-of-plane.

The conditions used during deposition of the buffer layer material can include, for example, a substrate temperature of from about 0° C. to about 750° C. (e.g., from about 0° C. to about 400° C., from about room temperature to about 750° C., from about room temperature to about 400° C.), a deposition rate of from about 1.0 Angstrom per second to about 4.4 Angstroms per second, an ion energy of from about 200 eV to about 1200 eV, and/or an ion flux of from about 110 microamperes per square centimeter to about 120 microamperes per square centimeter.

In some embodiments, when using IBAD, the substrate is formed of a material having a polycrystalline, non-amorphous base structure (e.g., a metal alloy, such as a nickel alloy) with a smooth amorphous surface formed of a different material (e.g., $Si_3N_4$).

In certain embodiments, a plurality of buffer layers can be deposited by epitaxial growth on an original IBAD surface. Each buffer layer can have substantial alignment (e.g., about 13° or less), both in-plane and out-of-plane.

A buffer material can be prepared using solution phase techniques, including metalorganic deposition, such as disclosed in, for example, S. S. Shoup et al., J. Am. Cer. Soc., vol. 81, 3019; D. Beach et al., Mat. Res. Soc. Symp. Proc., vol. 495, 263 (1988); M. Paranthaman et al., Superconductor Sci. Tech., vol. 12, 319 (1999); D. J. Lee et al., Japanese J. Appl. Phys., vol. 38, L178 (1999) and M. W. Rupich et al., I.E.E.E. Trans. on Appl. Supercon. vol. 9, 1527. In certain embodiments, solution coating processes can be used for epitaxial deposition of one or a combination of any of the oxide layers on textured substrates; however, they can be particularly applicable for deposition of the initial (seed) layer on a textured metal substrate. The role of the seed layer is to provide 1) protection of the substrate from oxidation during deposition of the next oxide layer when carried out in an oxidizing atmosphere relative to the substrate (for example, magnetron sputter deposition of yttria-stabilized zirconia from an oxide target); and 2) an epitaxial template for growth of subsequent oxide layers. In order to meet these requirements, the seed layer should grow epitaxially over the entire surface of the metal substrate and be free of any contaminants that may interfere with the deposition of subsequent epitaxial oxide layers.

The formation of oxide buffer layers can be carried out so as to promote wetting of an underlying substrate layer. Additionally, in particular embodiments, the formation of metal oxide layers can be carried out using metal alkoxide precursors (for example, "sol gel" precursors).

Once the textured substrate including buffer layers is prepared, a precursor solution is deposited at deposition station 930 as described above. Optionally, the precursor can be patterned. Additional equipment may be required to accomplish the patterning operation, for example, when laser ablation or ion bombardment are used to pattern the superconducting layer. If dropwise patterned deposition is used, then a single station equipped with a inkjet printer deposition apparatus can accomplish both deposition and patterning of the oxide precursor solution.

Typically, solution chemistry is used to prepare barium fluoride and/or other superconductor precursors; and a solution (e.g., a solution containing metal salts, such as yttrium acetate, copper acetate, barium acetate and/or a fluorinated acetate salt of barium) is disposed on a surface (e.g., on a surface of a substrate, such as a substrate having an alloy layer with one or more buffer layers disposed thereon). The solution can be disposed on the surface using standard techniques (e.g., spin coating, dip coating, slot coating). The solution is dried to remove at least some of the organic compounds present in the solution (e.g., dried at about room temperature or under mild heat), and the resulting material is reacted (e.g., decomposed) in a furnace in a gas environment containing oxygen and water to form barium fluoride and/or other appropriate materials (e.g., CuO and/or $Y_2O_3$). In some embodiments, the reactors noted above can be used in any or all of these steps.

Metal salt solutions are prepared using metal sources in the appropriate proportions desired in the resulting superconductor layer. Thus, for example, an additional amount of copper salt, in excess of the stoichiometric proportions used in YBCO, is included in a precursor solution used to prepare a high Ic(ab) superconductor layer having excess copper. Similarly, the precursor solution may contain additive components, including soluble and insoluble metal compounds, that are used to modify the final superconductor composition. Such additives can include, for example, soluble compounds of metal compounds such as yttrium, neodymium, samarium, europium, gadolinium, terbium, dysprosium, holmium, erbium, thulium, ytterbium, and lutetium, alkaline earth metals, such as calcium, manganese, iron, cobalt, nickel, zirconium, cerium, silver, aluminum, and magnesium, that are capable of dissolving in the solvents contained in the precursor solution. Additive components may also include stoichiometric excesses of soluble compounds included in the precursor solution. For example, soluble yttrium salts or soluble copper salts may be included in the precursor solution in excess of that required to form YBCO. Insoluble additive components can also be added to the precursor solution.

Examples of metal salt solutions that can be used are as follows.

In some embodiments, the metal salt solution can have a relatively small amount of free acid. In aqueous solutions, this can correspond to a metal salt solution with a relatively neutral pH (e.g., neither strongly acidic nor strongly basic). The metal salt solution can be used to prepare multi-layer superconductors using a wide variety of materials that can be used as the underlying layer on which the superconductor layer is formed.

The total free acid concentration of the metal salt solution can be less than about $1 \times 10^{-3}$ molar (e.g., less than about $1 \times 10^{-5}$ molar or about $1 \times 10^{-7}$ molar). Examples of free acids that can be contained in a metal salt solution include trifluoroacetic acid, acetic acid, nitric acid, sulfuric acid, acids of iodides, acids of bromides and acids of sulfates.

When the metal salt solution contains water, the precursor composition can have a pH of at least about 3 (e.g., at least about 5 or about 7).

In some embodiments, the metal salt solution can have a relatively low water content (e.g., less than about 50 volume percent water, less than about 35 volume percent water, less than about 25 volume percent water).

In embodiments in which the metal salt solution contains trifluoroacetate ion and an alkaline earth metal cation (e.g., barium), the total amount of trifluoroacetate ion can be selected so that the mole ratio of fluorine contained in the metal salt solution (e.g., in the form of trifluoroacetate) to the alkaline earth metal (e.g., barium ions) contained in the metal salt solution is at least about 2:1 (e.g., from about 2:1 to about 18.5:1, or from about 2:1 to about 10:1).

In general, the metal salt solution can be prepared by combining soluble compounds of a first metal (e.g., copper), a second metal (e.g., an alkaline earth metal), and a rare earth metal with one or more desired solvents and optionally water. As used herein, "soluble compounds" of the first, second and rare earth metals refer to compounds of these metals that are capable of dissolving in the solvent(s) contained in the metal salt solution. Such compounds include, for example, salts (e.g., nitrates, acetates, alkoxides, iodides, sulfates and trifluoroacetates), oxides and hydroxides of these metals.

In certain embodiments, a metal salt solution can be formed of an organic solution containing metal trifluoroacetates prepared from powders of $Ba(O_2CCH_3)_2$, $Y(O_2CCH_3)_3$, and $Cu(O_2CCH_3)_2$ which are combined and reacted using methods known to those skilled in the art. For example, the metal trifluoroacetate powders can be combined in a 2:1:3 ratio in methyl alcohol to produce a solution substantially 0.94 M based on copper content.

In certain embodiments, the metal salt solution can contain a Lewis base. The rare earth metal can be yttrium, lanthanum, europium, gadolinium, terbium, dysprosium, holmium, erbium, thulium, ytterbium, cerium, praseodymium, neodymium, promethium, samarium or lutetium. In general, the rare earth metal salt can be any rare earth metal salt that is soluble in the solvent(s) contained in the metal salt solution and that, when being processed to form an intermediate (e.g., a metal oxyhalide intermediate), forms rare earth oxide(s) (e.g., $Y_2O_3$). Such salts can have, for example, the formula $M(O_2C-(CH_2)_n-CXX'X'')(O_2C-(CH_2)_m-CX'''X''''X''''')(O_2C-(CH_2)_p-CX''''''X'''''''X'''''''')$ or $M(OR)_3$. M is the rare earth metal. n, m and p are each at least one but less than a number that renders the salt insoluble in the solvent(s) (e.g., from one to ten). Each of X, X', X'', X''', X'''', X''''', X'''''', X''''''' and X'''''''' is H, F, Cl, Br or I. R is a carbon containing group, which can be halogenated (e.g., $CH_2CF_3$) or nonhalogenated. Examples of such salts include nonhalogenated carboxylates, halogenated acetates (e.g., trifluoroacetate, trichloroacetate, tribromoacetate, triiodoacetate), halogenated alkoxides, and nonhalogenated alkoxides. Examples of such nonhalogenated carboxylates include nonhalogenated actetates (e.g., $M(O_2C-CH_3)_3$). The alkaline earth metal can be barium, strontium or calcium. Generally, the alkaline earth metal salt can be any alkaline earth metal salt that is soluble in the solvent(s) contained in the metal salt solution and that, when being processed to form an intermediate (e.g., a metal oxyhalide intermediate), forms an alkaline earth halide compound (e.g., $BaF_2$, $BaCl_2$, $BaBr_2$, $BaI_2$) prior to forming alkaline earth oxide(s) (e.g., BaO). Such salts can have, for example, the formula $M'(O_2C-(CH_2)_n-CXX'X'')(O_2C-(CH_2)_m-CX'''X''''X''''')$ or $M'(OR)_2$. M' is the alkaline earth metal. n and m are each at least one but less than a number that renders the salt insoluble in the solvent(s) (e.g., from one to ten). Each of X, X', X'', X''', X'''' and X''''' is H, F, Cl, B or, I. R can be a halogenated or nonhalogenated carbon containing group. Examples of such salts include halogenated acetates (e.g., trifluoroacetate, trichloroacetate, tribromoacetate, triiodoacetate). Generally, the transition metal is copper. The transition metal salt should be soluble in the solvent(s) contained in the metal salt solution. Preferably, during conversion of the precursor to the intermediate (e.g., metal oxyhalide), minimal cross-linking occurs between discrete transition metal molecules (e.g., copper molecules). Such transition metals salts can have, for example, the formula $M''(CXX'X''-CO(CH)_aCO-CX'''X''''X''''')(CX''''''X'''''''X''''''''-CO(CH)_bCO\ CX'''''''''X''''''''''X''''''''''')$, $M''(O_2C-(CH_2)_n-CXX'X')(O_2C-(CH_2)_m-CX'''X''''X''''')$ or $M''(OR)_2$. M'' is the transition metal. a and b are each at least one but less than a number that renders the salt insoluble in the solvent(s) (e.g., from one to five). Generally, n and m are each at least one but less than a number that renders the salt insoluble in the solvent(s) (e.g., from one to Br or I. R is a carbon containing group, which can be halogenated (e.g., $CH_2CF_3$) or nonhalogenated. These salts include, for example, nonhalogenated actetates (e.g., $M''(O_2C-CH_3)_2$), halogenated acetates, halogenated alkoxides, and nonhalogenated alkoxides. Examples of such salts include copper trichloroacetate, copper tribromoacetate, copper triiodoacetate, $Cu(CH_3COCHCOCF_3)_2$, $Cu(OOCC_7H_{15})_2$, $Cu(CF_3COCHCOF_3)_2$, $Cu(CH_3COCHCOCH_3)_2$, $Cu(CH_3CH_2CO_2CHCOCH_3)_2$, $CuO(C_5H_6N)_2$ and $Cu_3O_3Ba_2(O-CH_2CF_3)_4$. In certain embodiments, the transition metal salt is a carboxylate salt (e.g., a nonhalogenated carboxylate salt), such as a propionate salt of the transition metal (e.g., a nonhalogenated propionate salt of the transition metal). An example of a nonhalogenated propionate salt of a transition metal is $Cu(O_2CC_2H_5)_2$. In some embodiments, the transition metal salt is a simple salt, such as copper sulfate, copper nitrate, copper iodide and/or copper oxylate. In some embodiments, n and/or m can have the value zero. In certain embodiments, a and/or b can have the value zero. An illustrative and nonlimiting list of Lewis bases includes nitrogen-containing compounds, such as ammonia and amines. Examples of amines include $CH_3CN$, $C_5H_5N$ and $R_1R_2R_3N$. Each of $R_1$ $R_2$ $R_3$ is independently H, an alkyl group (e.g., a straight chained alkyl group, a branched alkyl group, an aliphatic alkyl group, a non-aliphatic alkyl group and/or a substituted alkyl group) or the like. Without wishing to be bound by theory, it is believed that the presence of a Lewis base in the metal salt solution can reduce cross-linking of copper during intermediate formation. It is believed that this is achieved because a Lewis base can coordinate (e.g., selective coordinate) with copper ions, thereby reducing the ability of copper to cross-link.

Typically, the metal salt solution is applied to a surface (e.g., a buffer layer surface), such as by spin coating, dip coating, web coating, slot coating, gravure coating, or other techniques known to those skilled in the art, and subsequently heated.

At a subsequent station 940, the precursor components are decomposed. In the case of precursor components including at least one fluoride-containing salt, the first step of the heating step is performed to decompose the metalorganic molecules to one or more oxyfluoride intermediates of the desired superconductor material.

Typically, the initial temperature in this step is about room temperature, and the final temperature is from about 190° C. to about 210° C., preferably to a temperature to about 200° C. Preferably, this step is performed using a temperature ramp of at least about 5° C. per minute, more preferably a temperature ramp of at least about 10° C. per minute, and most preferably a temperature ramp of at least about 15° C. per minute. During this step, the partial pressure of water vapor in the nominal gas environment is preferably maintained at from about 5 Torr to about 50 Torr, more preferably at from about 5 Torr to about 30 Torr, and most preferably at from about 20 Torr to about 30 Torr. The partial pressure of oxygen in the nominal gas environment is maintained at from about 0.1 Torr to about 760 Torr and preferably at about 730-740 Torr.

Heating is then continued to a temperature of from about 200° C. to about 290° C. using a temperature ramp of from about 0.05° C. per minute to about 5° C. per minute (e.g., from about 0.5° C. per minute to about 1° C. per minute). Preferably, the gas environment during this heating step is substantially the same as the nominal gas environment used when the sample is heated to from the initial temperature to from about 190° C. to about 215° C.

Heating is further continued to a temperature of about 650° C., or more preferably to a temperature of about 400° C., to form the oxyfluoride intermediate. This step is preferably performed using a temperature ramp of at least about 2° C. per minute, more preferably at least about 3° C. per minute, and most preferably at least about 5° C. per minute. Preferably, the gas environment during this heating step is substantially the same as the nominal gas environment used when the sample is heated to from the initial temperature to from about 190° C. to about 215° C.

In alternate embodiments, barium fluoride is formed by heating the dried solution from an initial temperature (e.g., room temperature) to a temperature of from about 190° C. to about 215° C. (e.g., about 210° C.) in a water vapor pressure of from about 5 Torr to about 50 Torr water vapor (e.g., from about 5 Torr to about 30 Torr water vapor, or from about 10 Torr to about 25 Torr water vapor). The nominal partial pressure of oxygen can be, for example, from about 0.1 Torr to about 760 Torr. In these embodiments, heating is then continued to a temperature of from about 220° C. to about 290° C. (e.g., about 220° C.) in a water vapor pressure of from about 5 Torr to about 50 Torr water vapor (e.g., from about 5 Torr to about 30 Torr water vapor, or from about 10 Torr to about 25 Torr water vapor). The nominal partial pressure of oxygen can be, for example, from about 0.1 Torr to about 760 Torr. This is followed by heating to about 400° C. at a rate of at least about 2° C. per minute (e.g., at least about 3° C. per minute, or at least about 5° C. per minute) in a water vapor pressure of from about 5 Torr to about 50 Torr water vapor (e.g., from about 5 Torr to about 30 Torr water vapor, or from about 10 Torr to about 25 Torr water vapor) to form barium fluoride. The nominal partial pressure of oxygen can be, for example, from about 0.1 Torr to about 760 Torr.

In certain embodiments, heating the dried solution to form barium fluoride can include putting the coated sample in a pre-heated furnace (e.g., at a temperature of at least about 100° C., at least about 150° C., at least about 200° C., at most about 300° C., at most about 250° C., about 200° C.). The gas environment in the furnace can have, for example, a total gas pressure of about 760 Torr, a predetermined partial pressure of water vapor (e.g. at least about 10 Torr, at least about 15 Torr, at most about 25 Torr, at most about 20 Torr, about 17 Torr) with the balance being molecular oxygen. After the coated sample reaches the furnace temperature, the furnace temperature can be increased (e.g., to at least about 225° C., to at least about 240° C., to at most about 275° C., to at most about 260° C., about 250° C.) at a predetermined temperature ramp rate (e.g., at least about 0.5° C. per minute, at least about 0.75° C. per minute, at most about 2° C. per minute, at most about 1.5° C. per minute, about 1° C. per minute). This step can be performed with the same nominal gas environment used in the first heating step. The temperature of the furnace can then be further increased (e.g., to at least about 350° C., to at least about 375° C., to at most about 450° C., to at most about 425° C., about 450° C.) at a predetermined temperature ramp rate (e.g., at least about 5° C. per minute, at least about 8° C. per minute, at most about 20° C. per minute, at most about 12° C. per minute, about 10° C. per minute). This step can be performed with the same nominal gas environment used in the first heating step.

The foregoing treatments of a metal salt solution can result in an oxyfluoride intermediate film in which the constituent metal oxides and metal fluorides are homogeneously distributed throughout the film. Preferably, the precursor has a relatively low defect density and is essentially free of cracks through the intermediate thickness. While solution chemistry for barium fluoride formation has been disclosed, other methods can also be used for other precursor solutions.

The superconductor intermediate film can then be heated to form the desired HTS layer at a further processing station 1050. Typically, this step is performed by heating from about room temperature to a temperature of from about 700° C. to about 825° C., preferably to a temperature of about 740° C. to 800° C. and more preferably to a temperature of about 750° C. to about 790° C., at a temperature ramp of about greater than 25° C. per minute, preferably at a temperature rate of about greater than 100° C. per minute and more preferably at a temperature rate about greater than 200° C. per minute. This step can also start from the final temperature of about 400-650° C. used to form the intermediate oxyfluoride film. During this step, a process gas is flowed over the film surface to supply the gaseous reactants to the film and to remove the gaseous reaction products from the film. The nominal gas environment during this step has a total pressure of about 0.1 Torr to about 760 Torr and is comprised of about 0.09 Torr to about 50 Torr oxygen and about 0.01 Torr to about 150 Torr water vapor and about 0 Torr to about 750 Torr of an inert gas (nitrogen or argon). More preferably, the nominal gas environment has a total pressure of about 0.15 Torr to about 5 Torr and is comprised of about 0.1 Torr to about 1 Torr oxygen and about 0.05 Torr to about 4 Torr water vapor.

The film is then held at a temperature of about 700° C.-825° C., preferably to a temperature of about 740° C. to 800° C. and more preferably to a temperature of about 750° C. to about 790° C., for a time of about at least 5 minutes to about 120 minutes, preferably for a time of at least about 15 minutes to about 60 minutes, and more preferably for a time of at least about 15 minutes to about 30 minutes. During this step, a process gas is flowed over the film surface to supply the gaseous reactants to the film and to remove the gaseous reaction products from the film. The nominal gas environment during this step has a total pressure of about 0.1 Torr to about 760 Torr and is comprised of about 0.09 Torr to about 50 Torr oxygen and about 0.01 Torr to about 150 Torr water vapor and about 0 Torr to about 750 Torr of an inert gas (nitrogen or argon). More preferably, the nominal gas environment has a total pressure of about 0.15 Torr to about 5 Torr and is comprised of about 0.1 Torr to about 1 Torr oxygen and about 0.05 Torr to about 4 Torr water vapor.

The film is then cooled to room temperature in a nominal gas environment with an oxygen pressure of about 0.05 Torr to about 150 Torr, preferably about 0.1 Torr to about 0.5 Torr and more preferably from about 0.1 Torr to about 0.2 Torr.

Optionally, filamentization can be performed at station 1060 by known processes, or by processes described in U.S. patent application Ser. No. 10/955,801, filed on Sep. 29, 2004. Further processing by noble metal deposition at station 1070, oxygen annealing at station 1080, and slitting at station 1090 complete the process.

EXAMPLE 1

Preparation of a Multilayer Conductor from Double Coated Superconducting Layers with Different Compositions A baseline YBCO precursor solution having a stoichiometry of Y:Ba:Cu of 1:2:3.23 was prepared by dissolving about 0.85 grams $Y(CF_3CO_2)_3$, about 1.45 grams of $Ba(CF_3CO_2)_2$ and about 1.35 grams of $Cu(C_2H_5CO_2)_2$ in about 4.85 mL of methanol ($CH_3OH$) and about 0.15 mL of propionic acid ($C_2H_6CO_2$). The final volume of the solution was adjusted to about 5 mL with methanol.

A baseline YBCO precursor solution with 50% dysprosium addition having a stoichiometry of Y:Dy:Ba:Cu of 1:0.5:2:3.23 was prepared by dissolving about 1.70 grams $Dy(CH_3CO_2)_3$, and about 1.90 mL of methanol ($CH_3OH$) in about 20 mL of baseline solution. The final volume of the solution was adjusted to about 25 mL with baseline solution.

1.2M $Cu(C_2H_5CO_2)_2$ solution was made by dissolving 1.24 g of $Cu(C_2H_5CO_2)_2$ powder in 4.85 ml of methanol and 0.15 ml of $C_2H_5CO_2H$.

The 50% Dy added precursor solution was deposited on a biaxially textured oxide buffered metallic substrate with the structure Ni(5 at %)W/$Y_2O_3$/YSZ/$CeO_2$ by slot die coating technique. The solution was coated on the buffered substrate with the amount targeted to form a 0.8 μm thick $REBa_2Cu_3O_{7-x}$ film.

The coated sample was decomposed to an intermediate metal oxyfluoride film by heating, in a 2.25" diameter tube furnace, from room temperature to about 200° C. at a rate of about 15° C. per minute, then from about 200° C. to about 250 C at a rate of about 0.9° C. per minute and then from about 250° C. to about 400° C. at a rate of about 5° C. per minute in a flowing gas environment having a total gas pressure of about 760 Torr (water vapor pressure of about 24 Torr and balance oxygen).

The metal oxyfluoride film was then coated with $Cu(C_2H_5CO_2)_2$ solution with targeted thickness of 0.1 μm. The coated film was dried at 95° C. through a heated tunnel. The dried film was then coated again with baseline solution prepared as mentioned earlier with target final thickness of 0.6 μm $YBa_2Cu_3O_x$.

Coated tape was decomposed again to form the intermediate metal oxyfluoride by the same process as mentioned earlier except this time the $H_2O$ vapor pressure was controlled to about 6.5 Torr.

The decomposed tape was heat treated to form an oxide superconductor. The tape was joined with 4 m of similarly coated NiW leader tape both in front and in the back to establish the uniform and control environment during the reaction. The tape was then reacted at 785° C. with the following parameters. The tape was ramped up to 785° C. with average ramp rate of about 520° C./min. During reaction, the total pressure during reaction was controlled to about 1 Torr. The $H_2O$ partial pressure was about 800 mTorr and oxygen partial pressure was about 200 mTorr. The reaction time was about 11 min. During cooling, a total pressure of about 1 Torr was used with oxygen partial pressure at about 200 mTorr and $N_2$ partial pressure at about 800 mTorr.

The reacted film was coated on both sides with 3 μm of Ag protection layer and then annealed in a 760 Torr oxygen environment. The resulting film carried a critical current of about 350 A/cm-width or a critical current density of about 2.5 $MA/cm^2$ at 77 K, self field.

The Ag coated 4 cm wide tape, which was nominally 4 m long, was slit into eight 4.1 mm wide strips using a roll slitter. These wires are referred to as "insert wires". Two adjacent insert wires from one side of the 4 cm wide strip, channels 1 and 2, were then solder laminated together with copper lamina.

The two insert wires were oriented so the Ag face covering the superconducting layer was facing away from each other. This orientation places the surfaces with the Ag face near the NiW substrate together. Continuous reel-to-reel solder lamination was used to form the 4-ply article. The lamination process joined 2 copper lamina to 2 insert wires using used a bath of 36Pb-62Sn-2Ag solder with a melting point of 179° C. operating at 225° C. and 4 m/min. The UNS type C15500 copper lamina was 4.3 mm wide and nominally 0.050 mm thick. The insert wires were 4.1 mm wide and nominally 0.083 mm thick. Both surfaces of each of the 4 lamina are fluxed in-line and wet to the solder before being aligned and pulled through a die in the lamination process. The final 4-ply article was nominally 4.3 wide and 0.27 mm thick. The critical current at 77 K, self field measured in 0.5 m segments over 2 m was 237, 240, 239, and 235 Amperes, respectively.

INCORPORATION BY REFERENCE

The following documents are hereby incorporated by reference: U.S. Pat. No. 5,231,074, issued on Jul. 27, 1993, and entitled "Preparation of Highly Textured Oxide Superconducting Films from MOD Precursor Solutions," U.S. Pat. No. 6,022,832, issued Feb. 8, 2000, and entitled "Low Vacuum Process for Producing Superconductor Articles with Epitaxial Layers," U.S. Pat. No. 6,027,564, issued Feb. 22, 2000, and entitled "Low Vacuum Process for Producing Epitaxial Layers," U.S. Pat. No. 6,190,752, issued Feb. 20, 2001, and entitled "Thin Films Having Rock-Salt-Like Structure Deposited on Amorphous Surfaces," PCT Publication No.

WO 00/58530, published on Oct. 5, 2000, and entitled "Alloy Materials," PCT Publication No. WO/58044, published on Oct. 5, 2000, and entitled "Alloy Materials," PCT Publication No. WO 99/17307, published on Apr. 8, 1999, and entitled "Substrates with Improved Oxidation Resistance," PCT Publication No. WO 99/16941, published on Apr. 8, 1999, and entitled "Substrates for Superconductors," PCT Publication No. WO 98/58415, published on Dec. 23, 1998, and entitled "Controlled Conversion of Metal Oxyfluorides into Superconducting Oxides," PCT Publication No. WO 01/11428, published on Feb. 15, 2001, and entitled "Multi-Layer Articles and Methods of Making Same," PCT Publication No. WO 01/08232, published on Feb. 1, 2001, and entitled "Multi-Layer Articles And Methods Of Making Same," PCT Publication No. WO 01/08235, published on Feb. 1, 2001, and entitled "Methods And Compositions For Making A Multi-Layer Article," PCT Publication No. WO 01/08236, published on Feb. 1, 2001, and entitled "Coated Conductor Thick Film Precursor", PCT Publication No. WO 01/08169, published on Feb. 1, 2001, and entitled "Coated Conductors With Reduced A.C. Loss" PCT Publication No. WO 01/15245, published on Mar. 1, 2001, and entitled "Surface Control Alloy Substrates And Methods Of Manufacture Therefor," PCT Publication No. WO 01/08170, published on Feb. 1, 2001, and entitled "Enhanced Purity Oxide Layer Formation," PCT Publication No. WO 01/26164, published on Apr. 12, 2001, and entitled "Control of Oxide Layer Reaction Rates," PCT Publication No. WO 01/26165, published on Apr. 12, 2001, and entitled "Oxide Layer Method," PCT Publication No. WO 01/08233, published on Feb. 1, 2001, and entitled "Enhanced High Temperature Coated Superconductors," PCT Publication No. WO 01/08231, published on Feb. 1, 2001, and entitled "Methods of Making A Superconductor," PCT Publication No. WO 02/35615, published on Apr. 20, 2002, and entitled "Precursor Solutions and Methods of Using Same," U.S. patent application Ser. No. 09/579,193, filed on May 26, 2000, and entitled, "Oxide Bronze Compositions And Textured Articles Manufactured In Accordance Therewith;" and U.S. Provisional Patent Application Ser. No. 60/309,116, filed on Jul. 31, 2001, and entitled "Multi-Layer Superconductors And Methods Of Making Same;" U.S. patent application Ser. No. 10/208,134, filed on Jul. 30, 2002, and entitled "Superconductor Methods and Reactor;" and U.S. Provisional Patent Application Ser. No. 60/308,957, filed on Jul. 31, 2001, and entitled "Superconductor Methods and Reactors;" and U.S. Provisional Patent Application Ser. No. 60/166,297, filed on Nov. 18, 1999, and entitled "Superconductor Articles and Compositions and Methods for Making Same;" and commonly owned U.S. patent application Ser. No. 09/615,999, filed on Jul. 14, 2000, and entitled "Superconductor Articles and Compositions and Methods for Making Same;" and U.S. Provisional Application No. 60/477,613, filed Jun. 10, 2003, and entitled "Superconductor Methods and Reactors;" and U.S. application Ser. No. 10/858,309, filed Jun. 4, 2004, and entitled "Superconductor Methods and Reactors;" and U.S. patent application Ser. No. 10/955,875, filed on Sep. 29, 2004, and entitled "Low AC Loss Filamentary Coated Superconductors;" and U.S. patent application Ser. No. 10/955,801, filed on Sep. 29, 2004, and entitled "Stacked Filamentary Superconductors;" and U.S. Provisional Patent Application Ser. No. 60/667,001, filed on Mar. 31, 2005, and entitled "Mesh-Type Stabilizer for Filamentary Coated Superconductors;" and U.S. patent application Ser. No. 60/703,815, filed on an even date herewith, and entitled "High Temperature Superconducting Wires and Coils," all of which are hereby incorporated by reference.

What is claimed is:

1. A laminated superconductor wire, comprising:
a superconductor wire assembly, said assembly having a length and a width, said assembly comprising
a first superconductor insert comprising a first high temperature superconductor layer overlaying a first biaxially textured substrate and a first electrically conductive cap layer overlaying and in electrical contact with the first superconductor layer, and
a second superconductor insert comprising a second high temperature superconductor layer overlaying a second biaxially textured substrate and a second electrically conductive cap layer overlaying and in electrical contact with the second superconductor layer,
wherein the first and second superconductor inserts are stacked and joined together at their respective biaxially textured substrates; and
an electrically conductive structure substantially surrounding the superconductor wire assembly, wherein the electrically conductive structure is in electrical contact with the each of the electrically conductive cap layers.

2. The wire of claim 1, wherein the first and second superconductor layers comprise a rare earth-alkaline earth-copper oxide.

3. The wire of claim 2, further comprising a first buffer layer interposed between the first superconductor layer and the first substrate, and a second buffer layer interposed between the second superconductor layer and the second substrate.

4. The wire of claim 1, wherein a bonding material bonds the first substrate and second substrate together.

5. The wire of claim 4, wherein the bonding material comprises a material selected from the group of electrically conductive materials and electrically nonconductive materials.

6. The wire of claim 4, wherein the first biaxially textured substrate and second biaxially textured substrate have surfaces that are treated to provide electrical contact between the biaxially textured substrates.

7. The wire of claim 4, wherein the bonding material comprises at least one layer of a conductive material and at least one layer of a non-conductive material.

8. The wire of claim 4, wherein the first biaxially textured substrate has a first wetting layer disposed on the opposite surface of the biaxially textured substrate that the first HTS layer overlays, and the second biaxially textured substrate has a second wetting layer disposed on the opposite surface of the biaxially textured substrate that the second HTS layer overlays, and wherein the first wetting layer and the second wetting layer bond the first and second biaxially textured substrates together.

9. The wire of claim 4, wherein the electrically conductive structure comprises:
a first conductive strip and a second conductive strip, wherein the superconductor wire assembly is interposed between and is in electrical contact with the first and second conductive strips; and
a substantially nonporous electrically conductive filler,
wherein the filler extends between the first and second conductive strips along the length of the superconductor wire assembly.

10. The wire of claim 9, wherein the first and second conductive strips comprise a metal independently selected from the group of aluminum, copper, silver, nickel, iron, stainless steel, aluminum alloy, copper alloy, silver alloy, nickel alloy, and iron alloy.

11. The wire of claim 9, wherein the first and second conductive strips have a width that is greater than the width of the superconductor wire assembly.

12. The wire of claim 11, wherein the width of the first and second conductive strips is between 0.01 and 2 mm greater than the width of the superconductor wire assembly.

13. The wire of claim 9, wherein the first and second conductive strips have a thickness between 0.01 and 2 mm.

14. The wire of claim 9, wherein the substantially nonporous electrically conductive filler has a thickness between 0.005 and 1 mm along a side of the superconductor wire assembly.

15. The wire of claim 9, wherein the substantially nonporous electrically conductive filler comprises a material selected from the group of solder, metal, metal alloy, metal amalgam, and conductive polymer.

16. The wire of claim 9, wherein the bonding material comprises the substantially nonporous electrically conductive filler.

17. The wire of claim 9, further comprising a layer of conductive material substantially surrounding the superconductor wire assembly.

18. The wire of claim 17, wherein the layer of conductive material is selected from the group of metal, electrically conductive polymer, polymer filled with fine metal powder, and conductive glue.

19. The wire of claim 9, wherein the electrically conductive structure comprises:
an electrically conductive layer that partially surrounds and is in electrical contact with the superconductor wire assembly along at least three sides; and
a substantially nonporous electrically conductive filler, wherein the filler substantially surrounds the superconductor wire assembly and bonds it to the conductive layer.

20. The wire of claim 19, wherein the electrically conductive layer comprises a metal selected from the group of aluminum, copper, silver, nickel, iron, stainless steel, aluminum alloy, copper alloy, silver alloy, nickel alloy, and iron alloy.

21. The wire of claim 19, wherein the electrically conductive layer has a thickness between 0.0001 and 1 mm.

22. The wire of claim 19, wherein the substantially nonporous electrically conductive filler substantially fills voids in the superconductor wire assembly and between the superconductor wire assembly and the conductive layer.

23. The wire of claim 19, wherein the substantially nonporous electrically conductive filler comprises a material selected from the group of solder, metal, metal alloy, metal amalgam, and conductive polymer.

24. The wire of claim 19, wherein the layer of conductive material is selected from the group of metal, electrically conductive polymer, polymer filled with fine metal powder, and conductive glue.

25. The wire of claim 9, wherein the electrically conductive structure comprises an electrically conductive material substantially surrounding and in electrical contact with the superconductor wire assembly.

26. The wire of claim 25, wherein the electrically conductive material comprises a material selected from the group of electrically conductive polymer, polymer filled with fine metal powder, and conductive glue.

27. The wire of claim 25, wherein the electrically conductive material comprises a conductive foil wrapped around said superconductor wire assembly.

28. The wire of claim 27, wherein the conductive foil comprises a metal selected from the group of aluminum, copper, silver, nickel, iron, stainless steel, aluminum alloy, copper alloy, silver alloy, nickel alloy, and iron alloy.

29. The wire of claim 28, further comprising at least one layer of a substantially nonporous material substantially surrounding the conductive foil.

30. The wire of claim 29, wherein the substantially nonporous material is selected from the group of solder, electrically conductive polymer, polymer filled with fine metal powder, conductive glue, and electrically nonconductive polymer.

31. A method of making a laminated superconductor wire, the method comprising:
providing a superconductor wire assembly, said assembly having a length and a width, said assembly comprising
a first superconductor insert having a first high temperature superconductor layer overlaying a first biaxially textured substrate and a first electrically conductive cap layer overlaying and in electrical contact with the first superconductor layer, and
a second superconductor insert having a second high temperature superconductor layer overlaying a second biaxially textured substrate and a second electrically conductive cap layer overlaying and in electrical contact with the second superconductor layer,
wherein the first and second superconductor inserts are stacked and joined together at their respective biaxially textured substrates; and
simultaneously
laminating the first and second high temperature superconductor inserts to corresponding first and second conductive strips with a substantially nonporous electrically conductive filler, and
depositing additional filler between the first and second conductive strips along the length of the superconductor wire assembly,
such that the first and second conductive strips and the filler together form an electrically conductive structure that substantially surrounds the superconductor wire assembly
wherein the electrically conductive structure is in electrical contact with the each of the electrically conductive cap layers.

32. The method of claim 31, further comprising providing a bonding material between the first and second substrate.

33. The method of claim 32, further comprising providing first and second wetting layers on a surface of the corresponding first and second substrates opposite the high temperature superconductor layer.

34. The method of claim 31, further comprising providing a first buffer layer interposed between the first superconductor layer and the first substrate, and a second buffer layer interposed between the second superconductor layer and the second substrate.

35. The method of claim 34, further comprising providing a first electrically conductive cap layer interposed between the first superconductor layer and the first conductive strip, and a second electrically conductive cap layer interposed between the second superconductor layer and the second conductive strip.

36. A superconductor wire assembly comprising:
a first superconductor insert comprising:
a first biaxially textured substrate;
a first high temperature superconductor layer overlaying the first biaxially textured substrate; and
a cap layer overlaying the first high temperature superconductor layer;
a second superconductor insert comprising:
a second biaxially textured substrate;

a second high temperature superconductor layer overlaying the second biaxially textured substrate; and a cap layer overlaying the second high temperature superconductor layer;

wherein the first and second superconductor inserts are stacked and joined together at their respective substrates.

37. The wire assembly of claim 36, further comprising a first buffer layer interposed between the first superconductor layer and the first substrate, and a second buffer layer interposed between the second superconductor layer and the second substrate.

* * * * *